(12) United States Patent
Fukuda

(10) Patent No.: US 7,379,350 B2
(45) Date of Patent: May 27, 2008

(54) SEMICONDUCTOR MEMORY DEVICE OPERATING USING READ ONLY MEMORY DATA

(75) Inventor: Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/487,514

(22) Filed: Jul. 17, 2006

(65) Prior Publication Data

US 2007/0230255 A1 Oct. 4, 2007

(30) Foreign Application Priority Data

Mar. 29, 2006 (JP) ............... 2006-091163

(51) Int. Cl.
G11C 11/00 (2006.01)
(52) U.S. Cl. .................. 365/189.05; 365/200
(58) Field of Classification Search .......... 365/189.05, 365/200
See application file for complete search history.

(56) References Cited

U.S. PATENT DOCUMENTS

| | | | | |
|---|---|---|---|---|
| 6,101,144 A | * | 8/2000 | Jo | 365/229 |
| 7,254,069 B2 | * | 8/2007 | Haraguchi et al. | 365/200 |
| 2001/0032295 A1 | * | 10/2001 | Tsai et al. | 711/118 |
| 2002/0012453 A1 | * | 1/2002 | Hashimoto et al. | 382/112 |
| 2004/0022110 A1 | * | 2/2004 | Haraguchi et al. | 365/222 |
| 2004/0057308 A1 | * | 3/2004 | Fukuda | 365/202 |
| 2005/0125595 A1 | * | 6/2005 | Takeuchi et al. | 711/103 |
| 2005/0198414 A1 | * | 9/2005 | Sugimoto | 710/52 |

FOREIGN PATENT DOCUMENTS

JP 2002-56671 2/2002

OTHER PUBLICATIONS

Fukashi Morishita, et al., "A 312MHz 16Mb Random-Cycle Embedded DRAM Macro with 73µW Power-Down Mode for Mobile Applications", Digest of Technical Papers, IEEE International Solid-State Circuits Conference, Session 11, DRAM, 11.2, Feb. 17, 2004, 9 pages.

* cited by examiner

Primary Examiner—Michael T Tran
(74) Attorney, Agent, or Firm—Oblon, Spivak, McClelland, Maier & Neustadt, P.C.

(57) ABSTRACT

A semiconductor memory device operating using initialization data, includes a first latch circuit which latches the initialization data, a memory cell array including a plurality of memory cells and having a first region and a second region, the first region storing data, and a buffer circuit having a function for accessing the first latch circuit, the buffer circuit transferring, to the second region, the initialization data transferred from the first latch circuit, and transferring, to the first latch circuit, the initialization data transferred form the second region.

20 Claims, 16 Drawing Sheets

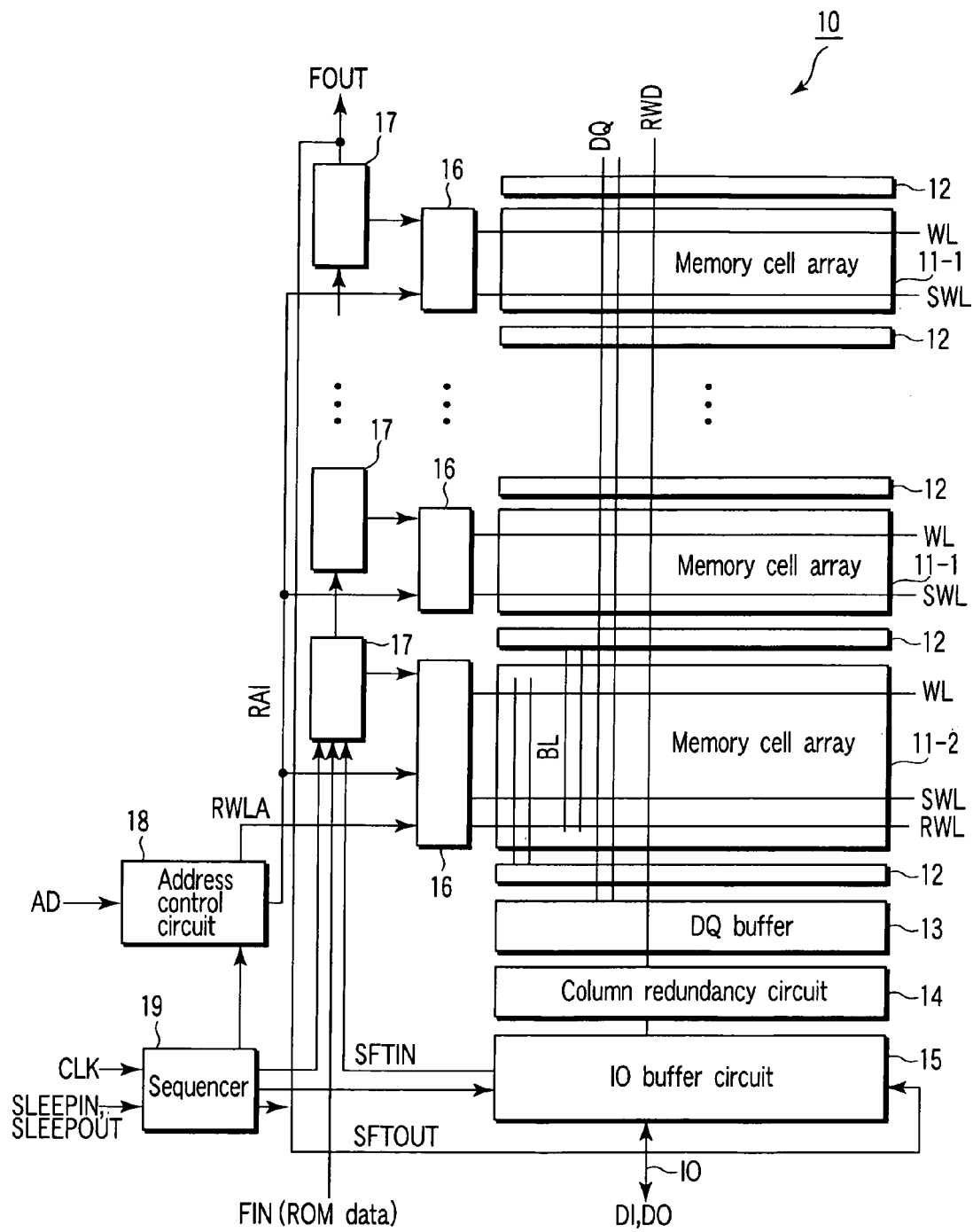
F I G. 1

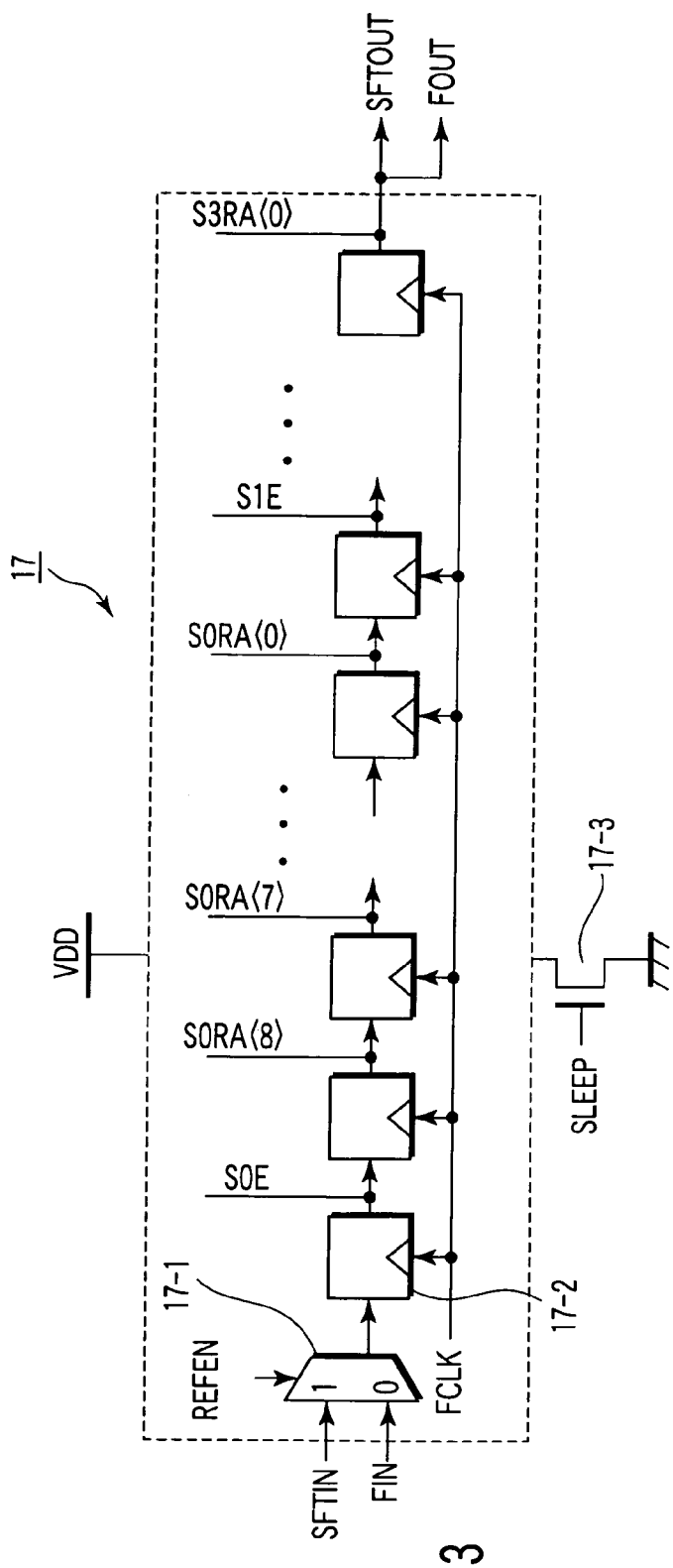
F I G. 3
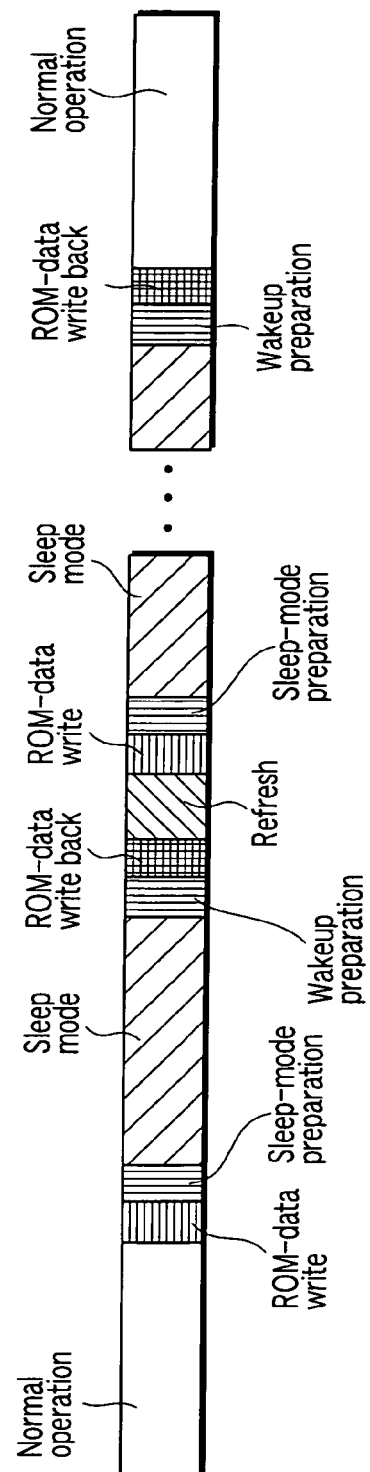
F I G. 5

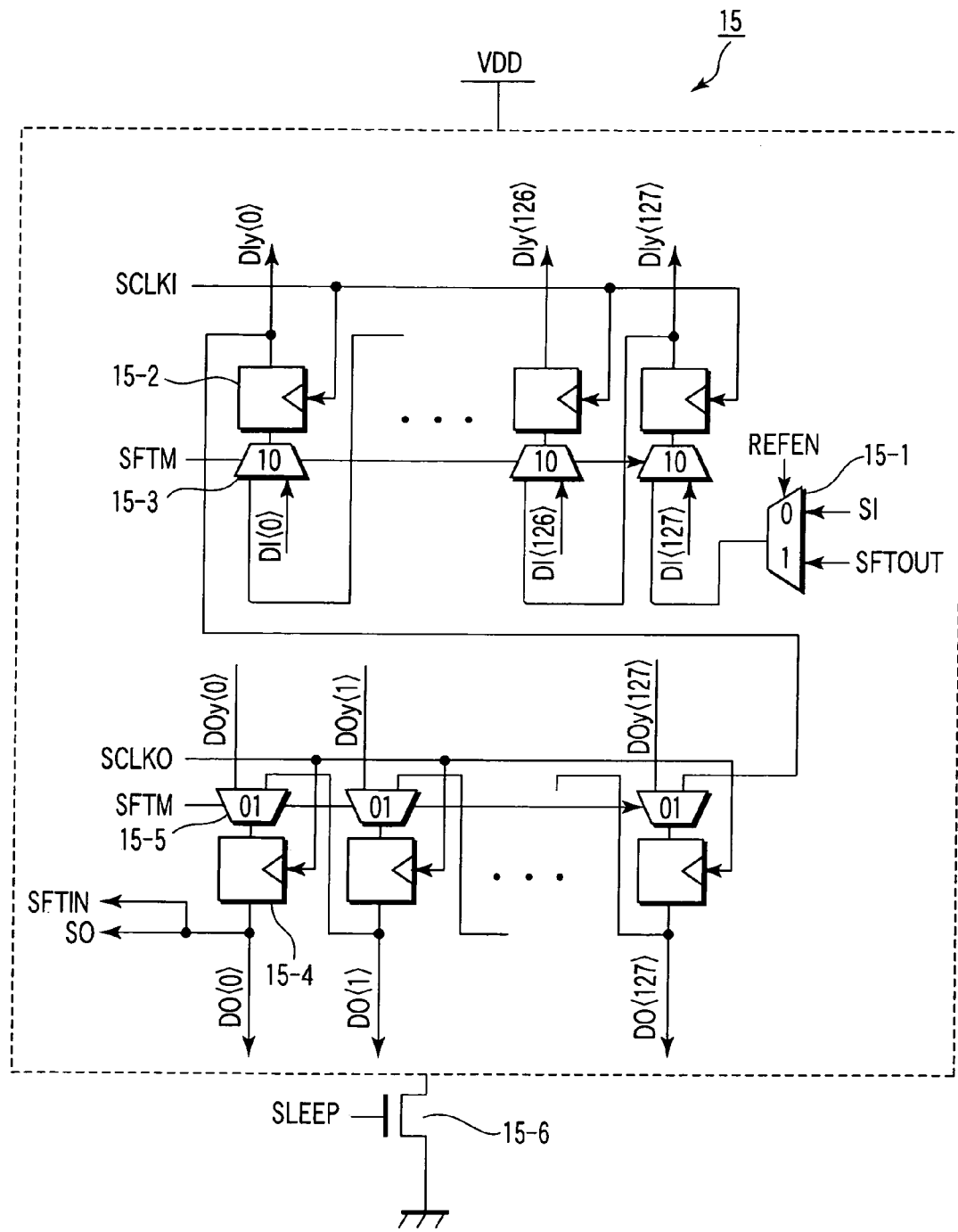
F I G. 4

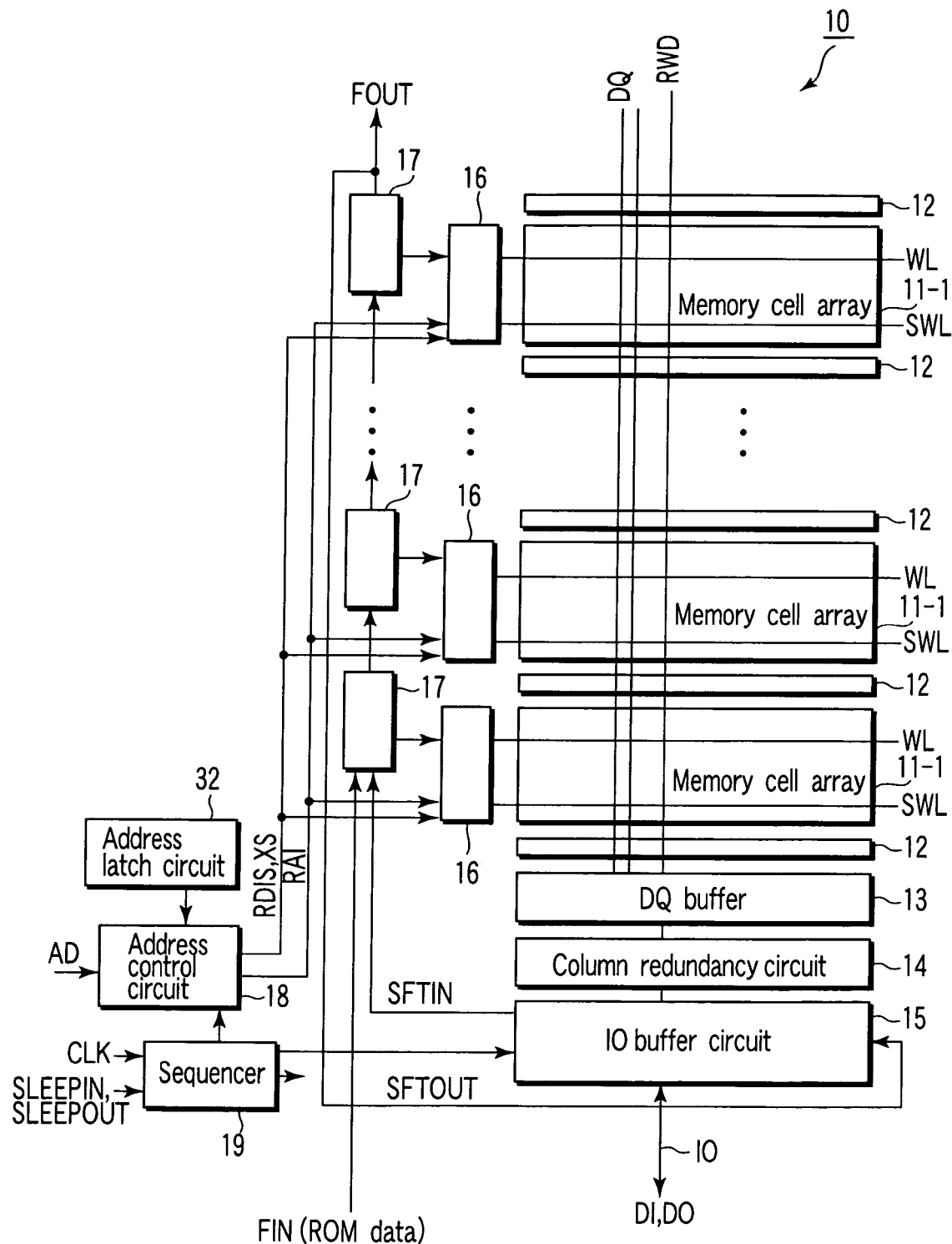
F I G. 17

SEMICONDUCTOR MEMORY DEVICE OPERATING USING READ ONLY MEMORY DATA

CROSS-REFERENCE TO RELATED APPLICATIONS

This application is based upon and claims the benefit of priority from prior Japanese Patent Application No. 2006-091163, filed Mar. 29, 2006, the entire contents of which are incorporated herein by reference.

BACKGROUND OF THE INVENTION

1. Field of the Invention

The present invention relates to a semiconductor memory device, and more particularly to a semiconductor memory device that operates using, for example, initialization data.

2. Description of the Related Art

Semiconductor memory devices for use in mobile apparatuses, such as cell-phones, employ a technique for reducing the consumption of power during a standby state by cutting the current paths of peripheral circuits connected to a memory cell array and memory bank that are not accessed. In these semiconductor memory devices, the peripheral circuits that are not accessed are set in a low power-consumption state called a sleep mode. To realize the sleep mode, a switching element (e.g., a transistor) is provided across each current path, and is turned on or off to close or open each current path.

A redundancy function for rescuing a defective cell in a memory cell array using a redundancy-circuit is well known. Redundancy data used for the redundancy function is, for example, transferred, upon turn-on of the power supply, from a nonvolatile element provided outside a semiconductor memory device.

When the sleep mode is employed for a semiconductor memory device having such the redundancy function, the consumption of power can be reduced by interrupting the supply of current to peripheral circuits (such as a sense amplifier circuit, DQ buffer, column redundancy circuit, IO buffer and row decoder). However, if the current path of a circuit that latches row redundancy data is cut, the row redundancy data is lost. In this case, initialization processing must again be performed, therefore a considerable time is required to recover the device. Further, initialization processing itself inevitably interferes with access to a memory cell array or other macros that are not in the sleep mode.

Latch circuits that must retain data in the sleep mode include, as well as that for redundancy data, a latch circuit for, for example, data used to control operation timing or an operation voltage. In particular, in the case of dynamic random access memories (DRAMs), a large number of data items must be retained in the sleep mode. Therefore, unless the supply of current to the circuits that retain the data items is interrupted, reduction of power consumption in the sleep mode cannot be realized.

A semiconductor integrated circuit having a data retaining function for reducing the consumption of current is disclosed as a technique relevant to the above (see Jpn. Pat. Appln. KOKAI Publication No. 2002-56671).

BRIEF SUMMARY OF THE INVENTION

According to an aspect of the present invention, there is provided a semiconductor memory device operating using initialization data, comprising: a first latch circuit which latches the initialization data; a memory cell array including a plurality of memory cells and having a first region and a second region, the first region storing data; and a buffer circuit having a function for accessing the first latch circuit, the buffer circuit transferring, to the second region, the initialization data transferred from the first latch circuit, and transferring, to the first latch circuit, the initialization data transferred form the second region.

BRIEF DESCRIPTION OF THE SEVERAL VIEWS OF THE DRAWING

FIG. 1 is a block diagram illustrating of a DRAM macro 10 according to a first embodiment of the invention;

FIG. 3 is a circuit diagram illustrating the ROM-data latch circuits 17 showing in FIG. 1;

FIG. 4 is a circuit diagram illustrating the IO buffer circuit 15 showing in FIG. 1;

FIG. 5 is a sequence diagram illustrating the operation of the DRAM macro 10;

FIG. 17 is a block diagram illustrating a DRAM macro 10 according to a sixth embodiment of the invention.

DETAILED DESCRIPTION OF THE INVENTION

Embodiments of the invention will be described with reference to the accompanying drawings. In the following description, like reference numbers denote like elements, and duplicate explanation will be given only when necessary.

First Embodiment

FIG. 1 is a block diagram illustrating a DRAM macro 10 according to a first embodiment of the invention. A DRAM macro (DRAM core) indicates a block that functions as a memory, and includes a memory cell array, decoder and sense amplifier, etc. The DRAM macro 10 receives initialization data from an external circuit.

Specifically, the initialization data is read from a nonvolatile read only memory (ROM), provided outside the DRAM macro 10, upon turn-on of the power supply (upon initialization). The initialization data will hereinafter be referred to as ROM data. The nonvolatile element ROM comprises, for example, a fuse element. Since the fuse element has many positional restrictions, and the number of fuse elements can be reduced if a large amount of data is compressed at a time, the way of transferring ROM data to the DRAM macro 10 upon turn-on of the power supply is often employed.

As the ROM data (initialization data), redundancy data for rescuing a defective cell using a redundancy cell array is used. A description will now be given of rescue using the redundancy data.

Figure 2:
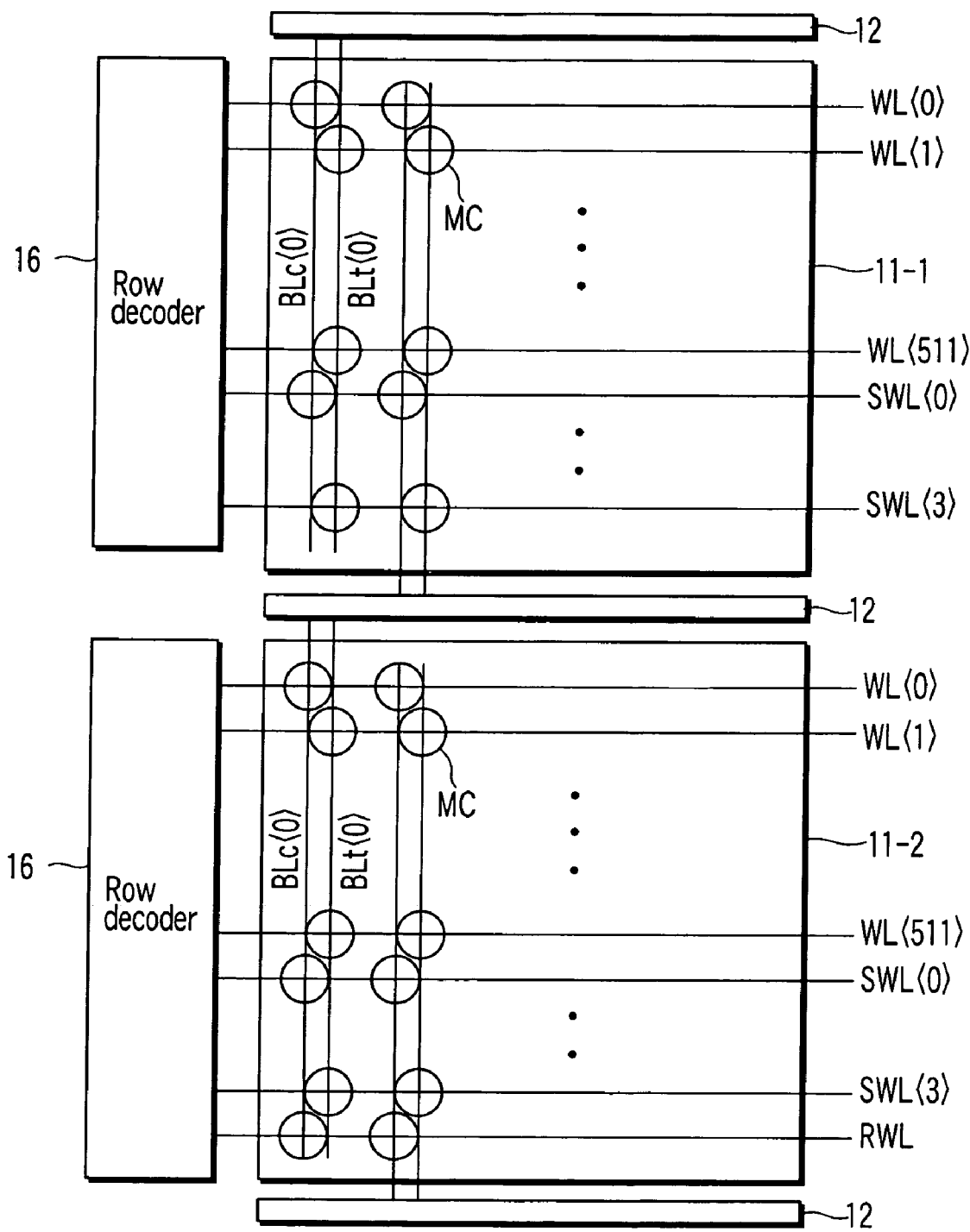
FIG. 2 is a block diagram illustrating of the memory cell arrays 11-1 and 11-2 showing in FIG. 1.

The DRAM macro 10 includes a plurality of memory cell arrays 11-1 and a memory cell array 11-2 with a ROM-data-storing function. FIG. 2 is a block diagram illustrating the logical organizations of the memory cell arrays 11-1 and 11-2 showing in FIG. 1.

The memory cell arrays 11-1 and 11-2 are each formed of a plurality of memory cells MC. Each of the memory cell arrays 11-1 and 11-2 includes, for example, 1024 bit lines BL (i.e., 512 pairs of bit lines BLt<0> to BTt<511>, bit lines BLc<0> to BTc<511>) extending in the column direction.

Further, each of the memory cell arrays 11-1 and 11-2 includes, for example, 512 word lines WL<0> to WL<511> and 4 spare word lines SLS<0> to SWL<3>, which extend in the row direction. The memory cell array 11-2 further includes, for example, a single word line RWL for ROM data extending in the row direction.

As described above, the DRAM macro 10 has a complementary bit-line structure including pairs of bit lines BLt and BLc. When a bit line included in a pair of bit lines is connected to a memory cell that is connected to an activated word line, the other bit line of the pair of bit lines is used as a reference bit line (for example, when the word line WL<0> is activated, the bit line BLt<0> is used as the reference bit line).

Memory cells MC are provided at the respective intersections of the bit lines and word lines. The memory cells MC are, for example, DRAM cells. The DRAM cells are each formed of a memory cell transistor CT and memory cell capacitor CC. One of the electrodes of the memory cell capacitor CC is connected to a plate line PL. The other electrode of the memory cell capacitor CC is connected to a bit line via the memory cell transistor CT. The gate of the memory cell transistor CT is connected to a word line WL.

The DRAM macro 10 includes a redundancy circuit for rescuing a defective cell. In general, a row or column including a defective cell is replaced with a redundancy cell row or column. In the case of replacement performed in units of rows, i.e., in the case of the row redundancy scheme, row addresses are programmed to fuse elements. In the case of replacement performed in units of columns, i.e., in the case of the column redundancy scheme, column addresses are programmed to fuse elements. The embodiments of the invention employ the row redundancy scheme as an example.

If a memory cell array contains a defective cell, the mentioned spare word line SWL is used. The spare word line SWL is connected to a plurality of redundancy memory cells which are replaced with the defective cell.

The memory cell array 11-2 differs from the other memory cell arrays 11-1 in that it has the ROM-data word line RWL. The word line RWL stores ROM data that should be retained in the sleep mode. The sleep mode indicates a low power consumption state or an internal-power-supply stopped state. In the low power consumption state, the supply of current to certain circuits is interrupted, and the data stored in memory cell arrays is retained as it is.

ROM data is supplied to ROM-data latch circuits 17 via a FIN line, and latched by them. The ROM-data latch circuits 17 supply the latched ROM data to respective row decoders 16.

An address control circuit 18 receives address signal AD from the outside. Based on address signal AD, the address control circuit 18 generates an internal address signal that contains internal row address signal RAI. The internal row address signal RAI generated by the address control circuit 18 is supplied to the row decoders 16.

The word lines provided for each memory cell array 11-1 are connected to the corresponding row decoder 16. The row decoder 16 receives internal row address signal RAI, and ROM data as redundancy data output from the corresponding ROM-data latch circuit 17. The address control circuit 18 supplies each row decoder 16 with internal row address signal RAI corresponding to external address signal AD. Upon receiving internal row address signal RAI, each row decoder 16 connected to the corresponding memory cell array 11-1 performs the following operation to activate the word lines of the memory cell array 11-1, if address signal RAI indicates one of the addresses assigned to each row decoder 16.

Firstly, the row decoders 16 compare internal row address signal RAI with ROM data (redundancy data) output from the ROM-data latch circuits 17. If the former does not indicate the latter, the word line WL corresponding to internal row address signal RAI is activated. In contrast, if the former indicates the latter, activation of the word line WL corresponding to internal row address signal RAI is interrupted, and the spare word line SWL corresponding to the word line is activated. Thus, the redundancy function is executed by comparing internal row address signal RAI with ROM data (redundancy data) output from the ROM-data latch circuits 17.

The row decoder 16 connected to the memory cell array 11-2 receives, from the address control circuit 18, activation signal RWLA for activating the ROM-data word line RWL. Upon receiving, from a sequencer 19, a word-line access signal for accessing the ROM-data word line RWL, the address control circuit 18 activates signal RWLA.

When signal RWLA is activated, the row decoder 16 connected to the memory cell array 11-2 activates the ROM-data word line RWL. Thus, the row decoder 16 connected to the memory cell array 11-2 has a function for accessing the word line RWL, in addition to the function of the row decoder 16 connected to each memory cell array 11-1.

A sense amplifier 12 detects and amplifies a small potential difference that occurs at the complementary bit lines corresponding to a memory cell MC when data is read from the cell MC. The potential difference, i.e., data, amplified by the sense amplifier 12 is transferred to low-order data lines (DQ lines) via column selection gates (CSL). The data transferred to the DQ line is transferred to high-order data lines (RWD lines) via the DQ buffer 13.

The DQ buffer 13 is connected to a column redundancy circuit 14 and IO buffer circuit 15 via the RWD lines. The data transferred to the RWD line is further transferred to an input/output line (I/O) via the IO buffer circuit 15, and output as output data DO from the input/output line (I/O) to the outside.

The IO buffer circuit 15 differs from the standard IO buffer in that the former has a function for accessing the ROM-data latch circuits 17 using an SFTIN line and SFTOUT line.

The sequencer 19 controls each circuit in the DRAM macro 10. Specifically, the sequencer 19 generates control signals for controlling the circuits of the DRAM macro 10, and supplies them to the circuits. The sequencer 19 receives external clock signal CLK and sleep-in signal SLEEPIN. Signal SLEEPIN is a signal for starting a sequence of operations to set the sleep mode. When signal SLEEPIN is activated (i.e., set at high level), a sequence of operations is performed to write ROM data to the memory cell array 11-2.

An internal power generation circuit (not shown) is incorporated in the DRAM macro 10. This circuit generates a voltage for activating the word lines WL, a voltage for operating the sense amplifier 12, and the plate voltage of each memory cell MC, etc., based on power supply voltage VDD and ground voltage VSS set at the power supply terminal.

The circuit design of the ROM-data latch circuits 17 will be described. FIG. 3 is a circuit diagram illustrating the circuit design of the ROM-data latch circuits 17 showing in FIG. 1.

The ROM-data latch circuits 17 receive signal SFTIN as the output of the IO buffer circuit 15, and signal FIN (ROM data) as the output of a certain circuit (not shown) for transferring ROM data during initialization. The latch circuits 17 comprise a multiplexer 17-1 and shift register. The shift register is formed of a plurality of flip-flips 17-2.

The multiplexer 17-1 has a control terminal supplied with a selection signal (in the embodiment, reference enable signal REFEN). When signal REFEN is activated, the multiplexer 17-1 outputs a signal (REFEN) input at the input terminal 1 side. When signal REFEN is inactivated, the multiplexer 17-1 outputs a signal (FIN) input at the input terminal 0 side. The output of the multiplexer 17-1 is input to the shift register (i.e., the initial-stage flip-flop 17-2).

The outputs of the flip-flips 17-2 are row redundancy data items. The row redundancy data items are expressed as, for example, S0E, S0RA<8> to S0RA<0>, S1E, S1RA<8> to S1RA<0>, S2E, S2RA<8> to S2RA<0> and S3E, S3RA<8> to S3RA<0>. Spare enable signal SiE (i=0, 1, 2, 3) indicates whether spare word line SWL<i> should be used. Spare address signal SiRA<k> (k=0, 1, . . . , 8) indicates the address assigned to a defective word line WL to be replaced with spare word line SWL<i>.

The output of the last-stage flip-flop 17-2 of the shift register is used as input SFTOUT input to the IO buffer circuit 15, and as output FOUT output to a circuit (not shown) to which ROM data is transferred during initialization.

Clock signal FCLK (generated by, for example, the sequencer 19) is an operation clock for the shift register of the latch circuits 17. This clock signal FCLK serves as a clock only a preset number of times, when ROM data is stored into the memory cell array 11-2 (ROM data writing) upon turn-on of power or upon setting the sleep mode, or when the data stored in the memory cell array 11-2 is latched by the latch circuit 17 (ROM-data write-back operation) upon finishing the sleep mode.

The latch circuits 17 are connected to the power supply voltage VDD terminal. The latch circuits 17 include an N-channel MOS transistor 17-3 for cutting leakage current, and is connected to the ground voltage VSS terminal via the transistor 17-3.

40 (10×4) flip-flops 17-2 are necessary for the first memory cell array, therefore a large amount of leakage current occurs. To reduce the amount of leakage current, the transistor 17-3 is employed. Sleep signal SLEEP that assumes low level in the sleep mode is input to the gate of the transistor 17-3. The sequencer 19 generates signal SLEEP based on, for example, signal SLEEPIN. Thus, the leakage current of the latch circuit 17 is greatly reduced by the transistor 17-3 in the sleep mode.

Since signal REFEN is inactivated upon turn-on of power, the latch circuits 17 function as part of a serial register chain extending from the FIN line to the FOUT line. In contrast, when ROM data is written or written back, signal REFEN is activated, the latch circuits 17 can access the memory cell array 11-2 via the IO buffer circuit 15.

The circuit design of the IO buffer circuit 15 will now be described. FIG. 4 is a circuit diagram illustrating the circuit design of the IO buffer circuit 15 showing in FIG. 1.

Around a standard DRAM macro, flip-flops are provided for scanning. There is a scan-test scheme as a technique for facilitating the test of an LSI and reducing the number of test patterns. In this scheme, certain circuits are added which enable the flip-flops existing in the LSI to set or read data. The flip-flops existing in a test-object circuit incorporated in the LSI form a scanning chain functioning as a shift register. In this circuit design, arbitrary data is set in each flip-flop, and the data retained by the flip-flops is observed from the outside.

The scan-test scheme enables the flip-flops in the LSI to be used as data input terminals or externally observable terminals. As a result, a sequential circuit that requires enormous numbers of input patterns to set the internal state of the LSI to a preset state can be handled as a combinational circuit that is not required to set the internal state. This facilitates automatic generation of test patterns used for the test.

In the embodiment, the flip-flops for scanning are used as access means for accessing the ROM-data latch circuits 17. Accordingly, the IO buffer circuit 15 also has a scanning function. The input of the scanning chain is SI, and the output is SO. In a shift mode (scan shift) during scanning, the scanning chain is accessed using SI and SO.

The IO buffer circuit 15 incorporates a multiplexer 15-1 and a scanning chain as a shift register. The multiplexer 15-1 has a control terminal supplied with reference enable signal REFEN. When signal REFEN is activated, the multiplexer 17-1 outputs a signal (SFTOUT) input at the input terminal 1 side. When signal REFEN is inactivated, the multiplexer 15-1 outputs a signal (SI) input at the input terminal 0 side. The output of the multiplexer 15-1 is input to the scanning chain.

The scanning chain operates as a shift register when selection signal SFTM is activated during scan shift, ROM-data writing, and ROM-data writing back.

The scanning chain includes a first scanning chain at the data input side, and a second scanning chain at the data output side. The first scanning chain is formed of, for example, 128 first scanning cells connected in series. Each first scanning cell has a flip-flop 15-2 and multiplexer 15-3.

The multiplexer 15-3 has a control terminal supplied with signal SFTM. Input data items DI<0> to DI<127> are externally input to the 128 multiplexers 15-3 at the input terminal 0 side. Data items DIy<0> to DIy<127> as the outputs of the flip-flops 15-2 are supplied as write data (input data) to the respective memory cell arrays during a normal operation. Data item DIy<k+1> (k=0, 1, . . . , 127) is input to the DI<k> multiplexer 15-3 at the input terminal 1 side.

As a result of this way of connection, the IO buffer circuit 15 executes a shift operation when signal SFTM is activated.

The wiring between the output DIy<k+1> of each flip-flop 15-2 and the input terminal 1 of the DI<k> multiplexer 15-3, the flip-flops 15-2 and multiplexers 15-3 are generally used as boundary scanning means. The functions of the embodiment can be realized simply by operating control signals without adding any particular circuit. This means that the area penalty is small.

Clock signal SCLKI is input to the clock terminal of each flip-flop 15-2. Clock operation of clock signal SCLKI is performed during a standard data input operation, scan shift, and ROM-data writing. Clock signal SCLKI is generated by the sequencer 19.

The second scanning chain for data output is formed of, for example, 128 second scanning cells connected in series. Each second scanning cell has a flip-flop 15-4 and multiplexer 15-5.

The multiplexer 15-5 has a control terminal supplied with signal SFTM. Output data items DOy<0> to DOy<127> are input to the 128 multiplexers 15-5 at the input terminal 0 side. Output data items DOy<0> to DOy<127> correspond to the data items read from the memory cell arrays during a normal operation. The outputs of the multiplexers 15-5 are supplied to the respective flip-flops 15-4. The outputs of DO<0> to DO<127> of the flip-flops 15-4 are output as output data to the outside of the DRAM macro 10. Further, output DOy<k+1> is input to the DO<k> multiplexer 15-5 at the input terminal 1 side. As a result of this way of connection, the IO buffer circuit 15 executes a shift operation when signal SFTM is activated.

The wiring between the output DOy<k+1> of each flip-flop 15-4 and the input terminal 1 of the DO<k> multiplexer 15-5, the flip-flops 15-4 and multiplexers 15-5 are generally used as boundary scanning means. The functions of the embodiment can be realized simply by operating control signals without adding any particular circuit.

Output DO<0> is used as scan shift data output SO, and as output SFTIN supplied to the latch circuit 17. Clock signal SCLKO is input to the clock terminal of each the flip-flop 15-4. Clock operation of clock signal SCLKO is performed during a normal data input operation, a scan shift, and ROM-data writing. Clock signal SCLKO is also generated by the sequencer 19.

The IO buffer circuit 15 is connected to the power supply voltage VDD terminal. Further, the IO buffer circuit 15 includes an N-channel MOS transistor 15-6 for cutting leakage current, and is connected to the ground voltage VSS terminal via the transistor 15-6. Sleep signal SLEEP is input to the gate of the transistor 15-6. Accordingly, the leakage current of, for example, the flip-flops is greatly reduced by the transistor 15-6 in the sleep mode.

The operation of the DRAM macro 10 constructed as the above will be described. FIG. 5 is a sequence diagram illustrating the operation of the DRAM-macro 10. The DRAM macro 10 performs a normal operation of reading and writing data.

After finishing the normal operations, the DRAM macro 10 executes writing of ROM data. After finishing the writing of the ROM data, the DRAM macro 10 performs sleep-mode preparation, and establishes the sleep mode.

The sleep mode is set to cut the current paths of unnecessary peripheral circuits to reduce the consumption of power. In the sleep-mode preparation for the sleep mode, a control signal for controlling the operations of the circuits that must be performed to set the sleep mode is generated and used to control, for example, transistors necessary for setting the sleep mode. When the sleep mode is released, the DRAM macro 10 executes a wakeup preparation, and then a ROM-data write-back operation.

After the ROM-data write-back operation, the DRAM macro 10 performs a refresh operation. In DRAMs, data is retained when each memory cell capacitor CC accumulates charge. Since charge is gradually reduced with time, each memory cell capacitor CC is completely discharged after a certain time elapses, thereby losing data. To prevent this, a refresh operation for charging each capacitor is performed in units of preset periods (refresh cycles). The refresh cycles indicate intervals at which the refresh operation is performed.

After the refresh operation, the DRAM macro 10 again executes the ROM-data write operation. After that, the DRAM macro 10 executes the sleep-mode preparation to establish the sleep mode.

When the mode is shifted from the sleep mode to the normal operation mode, the DRAM macro 10 executes the wakeup preparation, and then the ROM-data write-back operation. Thus, the macro 10 returns to the normal operation.

Figure 6:
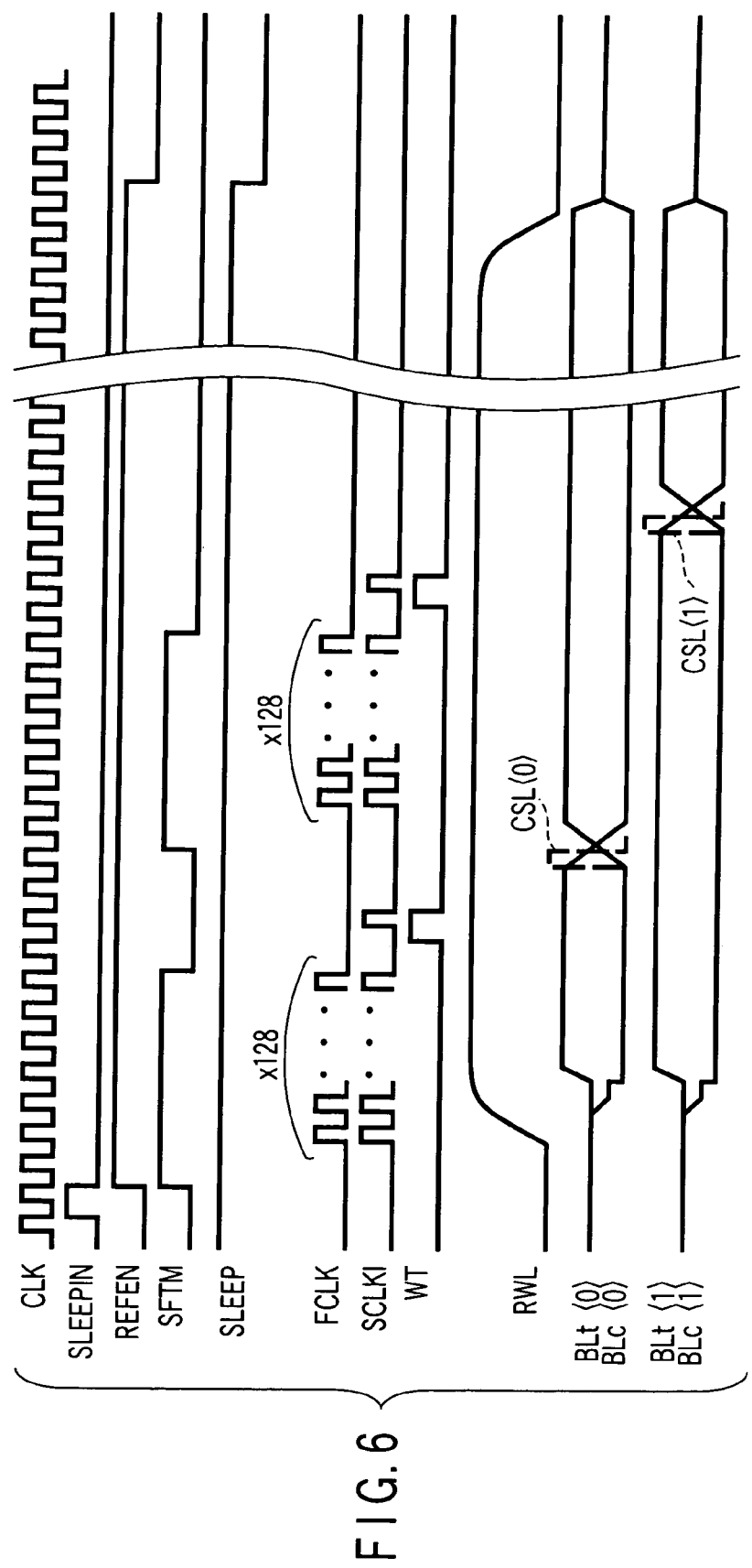
FIG. 6 is a timing chart illustrating the ROM-data write operation of the DRAM macro 10.

FIG. 6 is a timing chart illustrating the ROM-data write operation of the DRAM macro 10. As shown, the ROM-data write operation is executed after externally input signal SLEEPIN is activated (set at high level).

Firstly, signals REFEN and SFTM are activated (set at high levels), thereby establishing a shift register consisting of the ROM-data latch circuits 17 and the IO buffer circuit 15 connected in series. While signals REFEN and SFTM iterate their clock operations 128 times, 128-bit data in the latch circuits 17 is sent to the IO buffer circuit 15 via the SFTOUT line. The IO buffer circuit 15 latches the data.

On the other hand, the ROM-data word line RWL in the memory cell array 11-2 is activated. FIG. 6 shows timing charts of signals in two pairs of bit lines BLt/c<0> and BLt/c<1> in the memory cell array 11-2.

After signals REFEN and SFTM iterate their clock operations 128 times, signal SFTM is inactivated. Subsequently, write command WT is activated and clock signal SCLKI performs a one-pulse clock operation. At this time, the address assigned to the memory cell array that executes write command WT is set to indicate the memory cell array 11-2.

Upon activation of $0^{th}$-column selection gates CSL<0>, the ROM data latched by the IO buffer circuit 15 is transferred to the sense amplifier 12 via the column redundancy circuit 14 and DQ buffer 13. The transferred data is written to the memory cells MC on the word line RWL connected to column selection gates CSL<0>.

Subsequently, signal SFTM is activated (set at high level), thereby establishing a shift register consisting of the ROM-data latch circuits 17 and the IO buffer circuit 15 connected in series. While signals FCLK and SCLKI iterate their clock operations 128 times, 128-bit data in the latch circuits 17 is sent to the IO buffer circuit 15 via the SFTOUT line.

After signals FCLK and SCLKI iterate their clock operations 128 times, signal SFTM is inactivated. Subsequently, write command WT is activated and clock signal SCLKI performs a one-pulse clock operation. At this time, the address assigned to the memory cell array that executes write command WT is set to indicate the memory cell array 11-2.

Upon activation of $1^{st}$-column selection gates CSL<1>, the ROM data latched by the IO buffer circuit 15 is transferred to the sense amplifier 12 via the column redundancy circuit 14 and DQ buffer 13. The transferred data is written to the memory cells MC on the word line RWL connected to column selection gates CSL<1>.

By iterating the above operations, all the ROM data in the latch circuits 17 can be written to the memory cells on the word line RWL. When the word line RWL is inactivated after that state, the bit line BL is made to have an equalized state, with the ROM data stored in the memory cells MC on the word line RWL. Thereafter, signal REFEN is inactivated (set at low level).

Further, signal SLEEP is set at low level, whereby the N-channel MOS transistors 17-3 and 15-6 for cutting leakage current are turned off. As a result, the leakage currents of the IO buffer circuit 15 and latch circuits 17 can be reduced.

Figure 7:
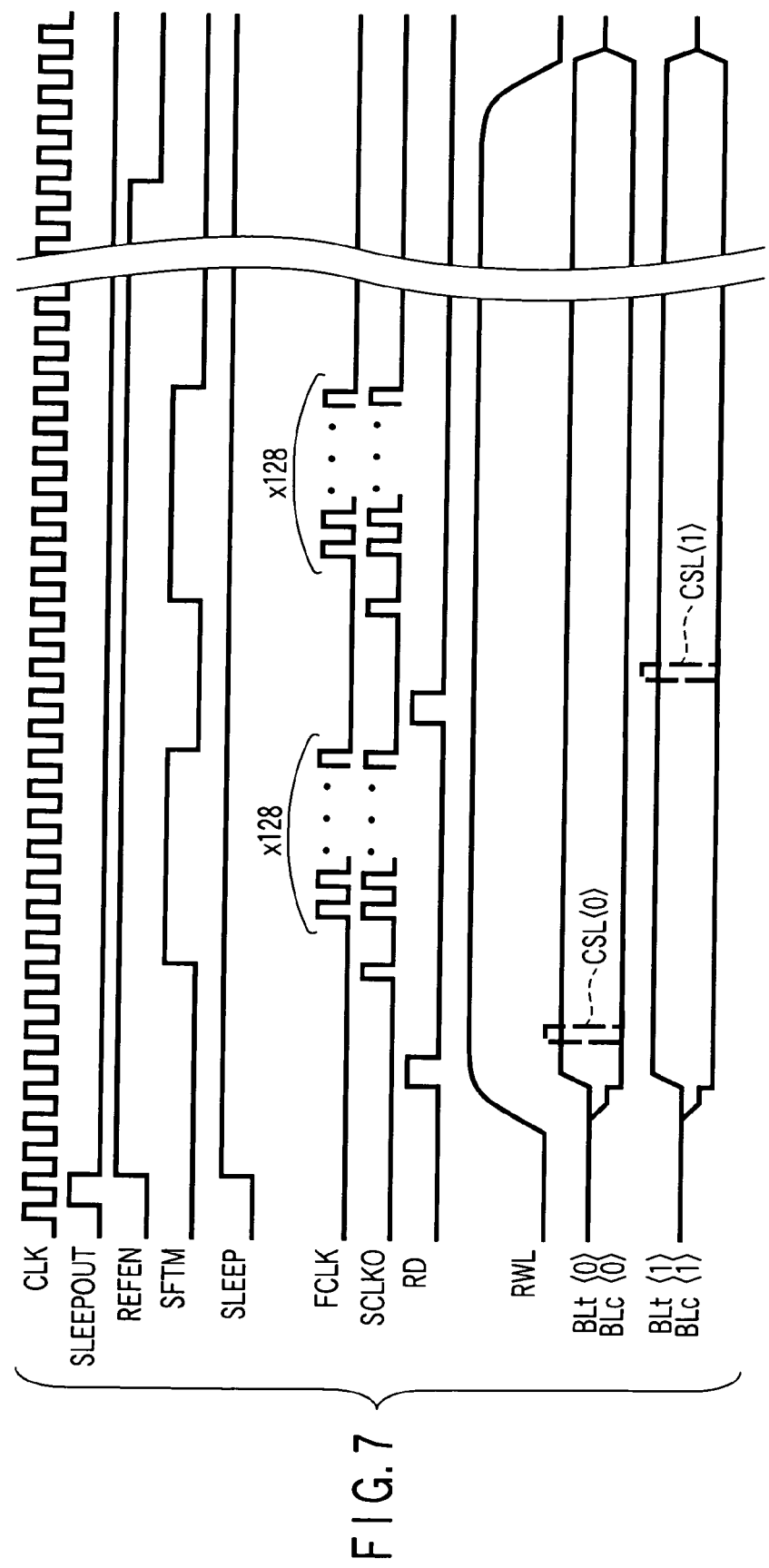
FIG. 7 is a timing chart illustrating the ROM data write-back operation of the DRAM macro 10.

FIG. 7 is a timing chart illustrating the ROM data write-back operation of the DRAM macro 10. Externally input signal SLEEPOUT is a signal for releasing the sleep mode. After signal SLEEPOUT is activated (set at high level), the ROM data write-back operation is performed.

Firstly, signal SLEEP is set at high level, thereby activating the circuits, the supply of current to which is interrupted. Subsequently, signal REFEN is activated, and then the ROM-data word line RWL is activated. FIG. 7 shows timing charts of signals in two pairs of bit lines BLt/c<0> and BLt/c<1> in the memory cell array 11-2.

When the word line RWL is activated, ROM data is transferred to the sense amplifier 12 connected to the bit line pair BLt/c<0>. After that, read command RD is activated. At this time, the address assigned to the memory cell array that executes read command RD is set to indicate the memory cell array 11-2.

Upon activation of $0^{th}$-column selection gates CSL<0>, data that is included in the ROM data transferred to the sense amplifier 12, and corresponds to column selection gates CSL<0> is sent to the IO buffer circuit 15 via the DQ buffer 13 and column redundancy circuit 14. The IO buffer circuit latches the data.

When a time corresponding to read latency after activation of read command RD elapses, clock signal SCLKO executes a one-pulse operation. Subsequently, signal SFTM is activated (set at high level), and while clock signals FCLK and SCLKO iterate their clock operations 128 times, the ROM data latched by the IO buffer circuit 15 is transferred to the latch circuits 17. Namely, at this time, ROM data items do not reach an objective latch circuit 17.

Thereafter, signal SFTM is inactivated, and read command RD is activated. At this time, the address assigned to the memory cell array that executes read command RD is set to indicate the memory cell array 11-2.

Upon activation of $1^{st}$-column selection gates CSL<1>, data that is included in the ROM data transferred to the sense amplifier 12, and corresponds to column selection gates CSL<1> is sent to the IO buffer circuit 15 via the DQ buffer 13 and column redundancy circuit 14.

When a time corresponding to read latency after activation of read command RD elapses, clock signal SCLKO executes a one-pulse operation. Subsequently, signal SFTM is activated (set at high level), and while clock signals FCLK and SCLKO iterate their clock operations 128 times, the ROM data sent to the IO buffer circuit 15 is transferred to one of the latch circuits 17. Namely, at this time, ROM data items do not reach the objective latch circuit 17, and they are advanced by 128 bits. When the above operations are iterated, the ROM data items are written back to the respective latch circuits 17.

Thereafter, signal REFEN is inactivated (set at low level), and the word line RWL is also inactivated. After these operations, the normal operation and refresh operation can be performed for the first time.

As described above in detail, before establishing the sleep mode, the ROM data latched by the ROM-data latch circuits 17 can be written to the memory cell array 11-2 via the IO buffer circuit 15. This enables the supply of current to the latch circuits 17 to be interrupted in the sleep mode, which contributes to the reduction of power consumption of the entire chip.

Further, after the sleep mode is released, the ROM data stored in the memory cell array 11-2 can be written back to the latch circuits 17 via the IO buffer circuit 15. As a result, the DRAM macro 10 can perform an operation using ROM data after the sleep mode is released. Namely, it is not necessary to transfer ROM data from the outside to the DRAM macro 10, after the sleep mode is released, which reduces the time required to recover from the sleep mode.

Furthermore, it is also unnecessary to perform re-initialization, therefore interference with or influence upon another macro or a memory cell that is not in the sleep mode does not occur. This being so, malfunction of the circuits can be suppressed, for example.

Although in the first embodiment, row redundancy data is employed as an example of ROM data (initialization data), it is a matter of course that another type of data may be employed. The first embodiment is also applicable to data for regulating the operation timing of each memory cell array, or data for regulating the operation voltage. Moreover, signals output from circuits formed of, for example, transistors vary in analog amount due to variations in characteristic between the transistors. The first embodiment is also applicable to, for example, trimming data for correcting the different analog amounts to a preset value.

Second Embodiment

As described above, various types of data can be used as ROM data. However, if column redundancy data for the memory cell array 11-2 having the ROM-data word line RWL, or initialization data for the memory cell array 11-2 is stored in the memory cell array 11-2, the memory cell array 11-2 cannot operate normally when the sleep mode is released. Therefore, operation-regulating data necessary for the basic operations of the memory cell array 11-2 must be transferred thereto only when initialization is performed, as in the prior art.

In the second embodiment, different data paths are imparted to the ROM data stored in the memory cell array 11-2 in the sleep mode, and the ROM data transferred to the memory cell array 11-2 during initialization.

Figure 8:
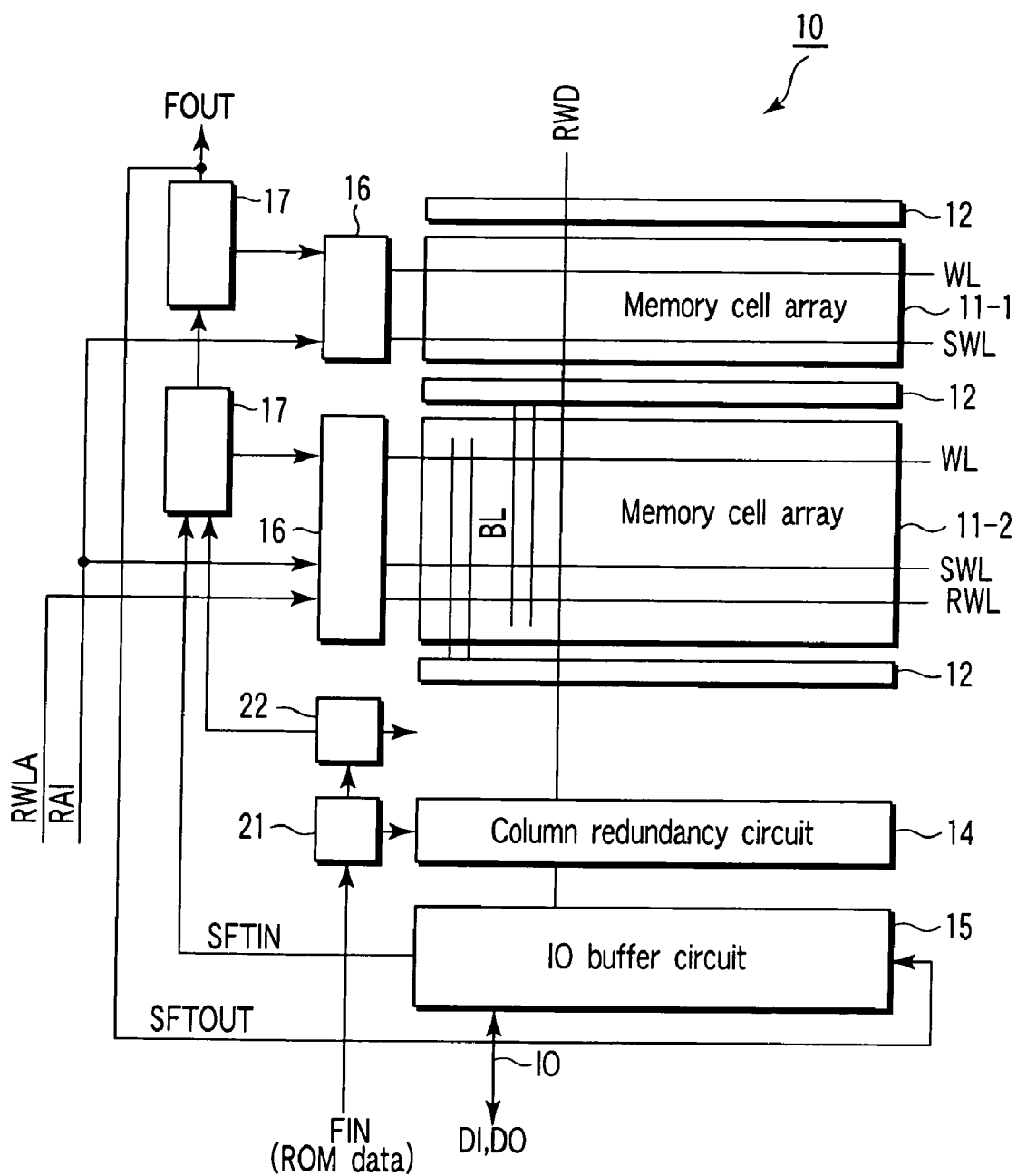
FIG. 8 is a block diagram illustrating a DRAM macro 10 according to a second embodiment of the invention.

FIG. 8 is a block diagram illustrating a DRAM macro 10 according to the second embodiment. Note that FIG. 8 shows only the essential part of the second embodiment. As shown, the DRAM macro 10 comprises a column redundancy latch circuit 21 and operation-regulating latch circuit 22.

The operation-regulating latch circuit 22 latches operation-regulating data for the memory cell array 11-2. Since the operation-regulating data regulates the operation of the memory cell array 11-2, power for the operation-regulating data is not interrupted even in the sleep mode. Accordingly, the latch circuit 22 is connected to an initialization path, but disconnected from SFTIN and SFTOU paths.

The column redundancy latch circuit 21 latches column redundancy data. The column redundancy data is also necessary for operating the memory cell array 11-2. Accordingly, the column redundancy latch circuit 21 is also connected to the initialization path, but disconnected from the SFTIN and SFTOUT paths (lines). The latch circuits 21 and 22 are supplied with power even in the sleep mode. Like the ROM-data latch circuits 17, the latch circuits 21 and 22 are formed of a plurality of flip-flops and multiplexers.

Upon turn-on of the power supply (during initialization), ROM data is input to the latch circuit 21 via a FIN line. The latch circuits 21, 22 and 17 form shift registers, and the ROM data is transferred in the shift registers. Lastly, the latch circuits 17 latch row redundancy data, the latch circuit 21 latches column redundancy data, and the latch circuit 22 latches the operation-regulating data for the memory cell array 11-2.

The SFTIN and SFTOUT lines are transfer paths used when the ROM-data write operation and write-back operation are performed. The ROM-data write and write-back operations using the SFTIN and SFTOUT lines are similar to those performed in the first embodiment. In the sleep mode, the supply of power to the latch circuits 17 is interrupted, whereas the supply of power to the latch circuits 21 and 22 is not interrupted.

In the DRAM macro 10 constructed as the above, data can be retained by the latch circuits 21 and 22 even in the sleep mode. As a result, when the sleep mode is released, the DRAM macro 10 can normally write back row redundancy data to the latch circuit 17.

Further, since the initialization path and the paths used for the ROM-data write and write-back operations can be individually prepared, as many current paths to the circuits not necessary in the sleep mode as possible can be cut. As a result, the consumption of power can be reduced.

Third Embodiment

Figure 9:
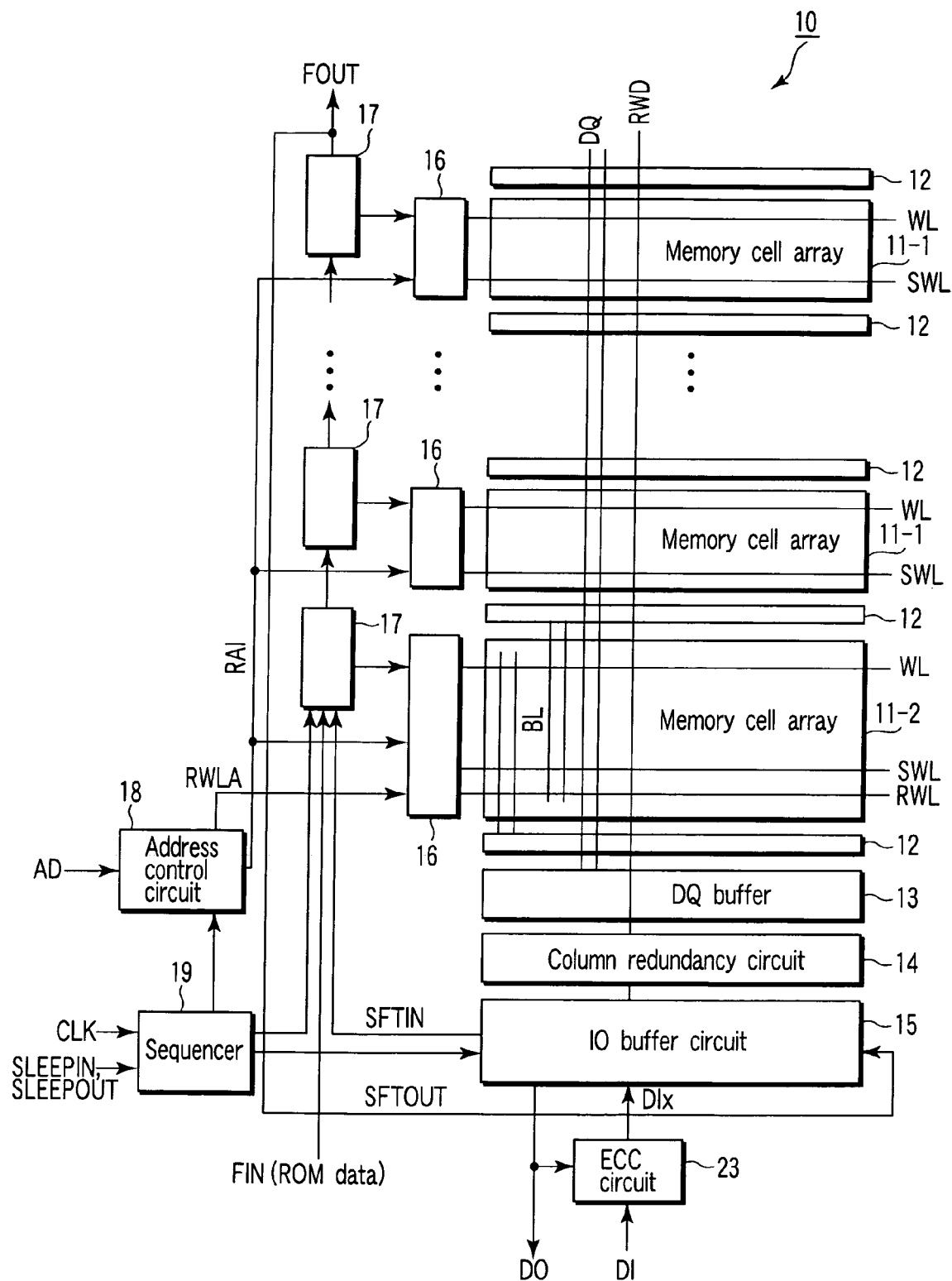
FIG. 9 is a block diagram illustrating a DRAM macro 10 according to a third embodiment of the invention.

A third embodiment of the invention is directed to a DRAM macro 10 that has an error check and correct (ECC) function for correcting errors in ROM data. FIG. 9 is a block diagram illustrating the DRAM macro 10 according to the third embodiment.

As mentioned above, DRAMs require refreshing of data. However, there may be a bit (memory cell MC) in which data cannot be retained during the refresh cycle, and hence an error occurs. In particular, if a long refresh cycle is set, errors may well occur. There may be a case where such a bit (weak bit) with degraded retention property exists on the ROM-data word line RWL.

The DRAM macro of the third embodiment comprises an ECC circuit 23 for correcting the error of such a weak bit. The ECC circuit 23 corrects such an error to prevent the DRAM macro 10 from becoming a defective product. Specifically, the ECC circuit 23 generates an ECC code, and corrects, using the ECC code, an error in data read from the memory cell array 11-2.

As shown in FIG. 9, the ECC circuit 23 receives input data DI from the outside, and receives output data DO output from the IO buffer circuit 15. The ECC circuit 23 outputs input data DIx.

Figure 10:
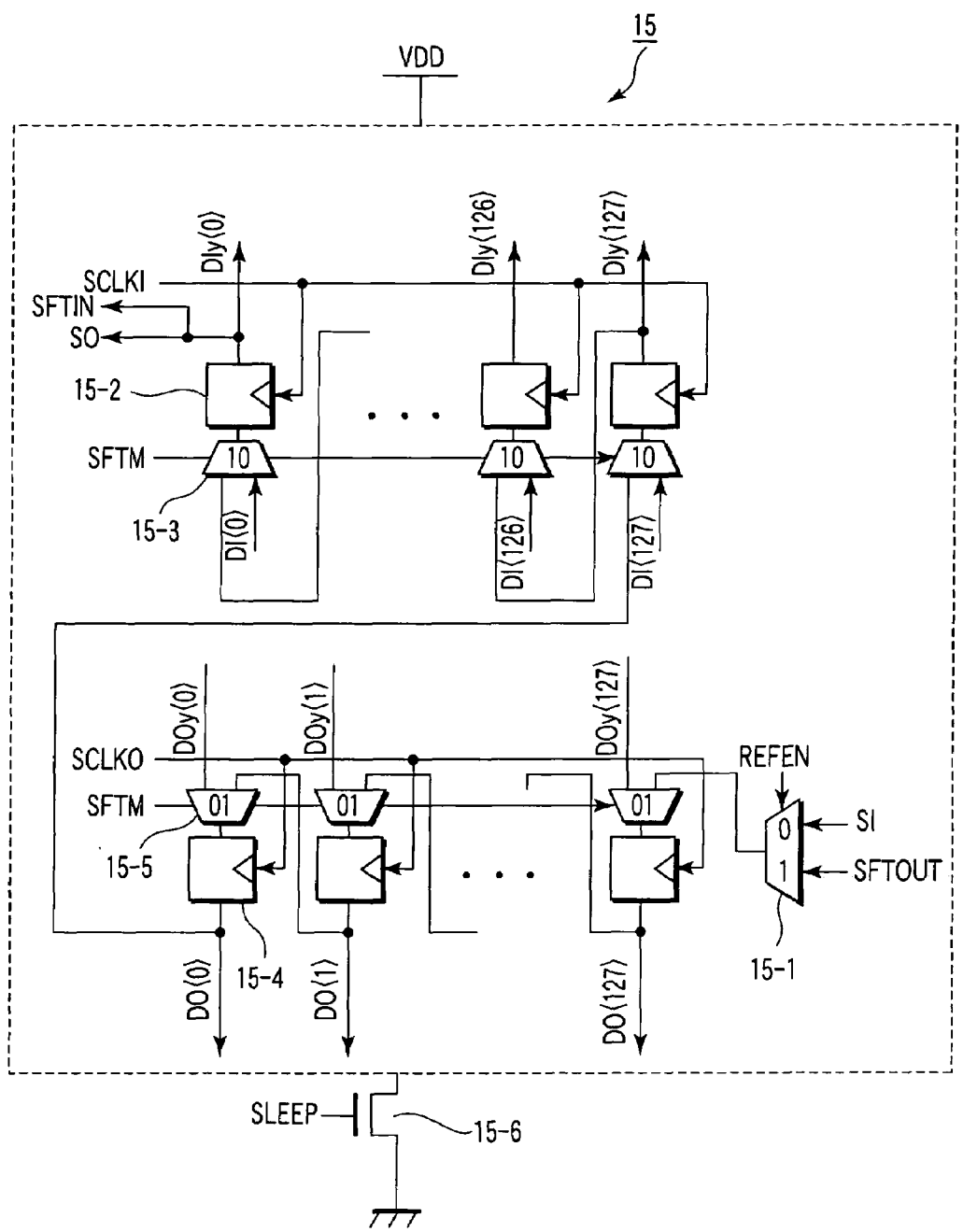
FIG. 10 is a circuit diagram illustrating the IO buffer circuit 15 showing in FIG. 9.

FIG. 10 is a circuit diagram illustrating the circuit design of the IO buffer circuit 15 showing in FIG. 9. The IO buffer circuit 15 of the third embodiment differs from that of the first embodiment shown in FIG. 4 in the way of connection of the DI-side flip-flops and DO-side flip-flops.

As shown in FIG. 10, the IO buffer circuit 15 comprises a multiplexer 15-1 and a scan chain. The output of the multiplexer 15-1 is input to the input terminal 1 of a multiplexer 15-5 that corresponds to DO<127>.

Output DO<0> is input to the input terminal 1 of a multiplexer 15-3 that corresponds to DI<127>. The output DIy<0> of a flip-flop 15-2 that corresponds to DI<0> is used as scan shift data output SO and output SFTIN sent to the ROM-data latch circuits 17. The other parts of the circuit design are similar to those of the IO buffer circuit 15 of FIG. 4.

Figure 11:
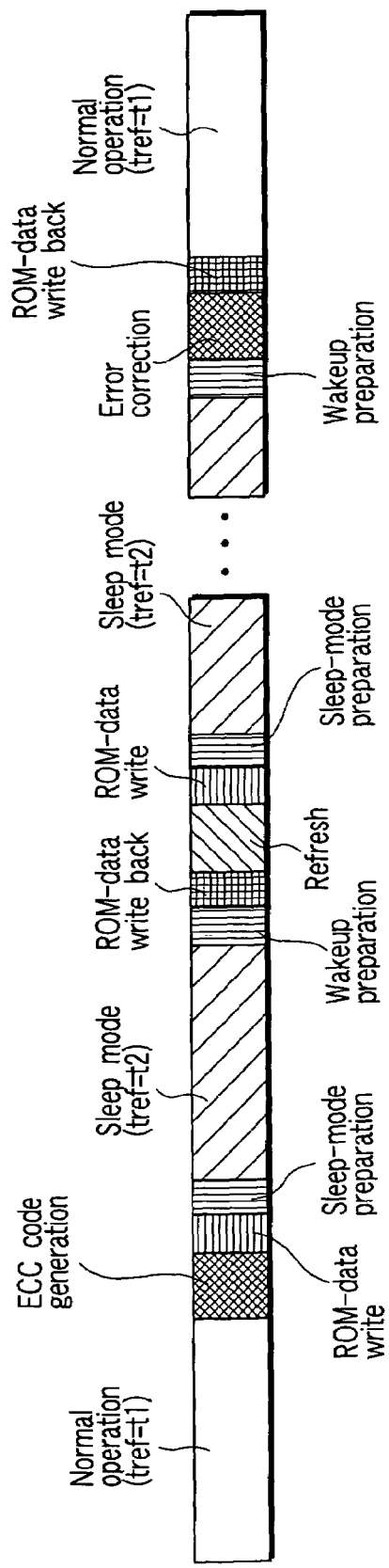
FIG. 11 is a sequence diagram illustrating the operation of a DRAM macro 10 according to a third embodiment.

The operation of the DRAM macro 10 constructed as the above will be described. FIG. 11 is a sequence diagram illustrating the operation of the DRAM macro 10. When the DRAM macro 10 executes a normal operation of reading and writing data, it operates in refresh cycles tref of t1 without using the ECC function.

The DRAM macro 10 cuts the current paths to unnecessary peripheral circuits, and increases the refresh cycle tref to t2 (t2>t1) using the ECC function, thereby reducing the consumption of power. After finishing the normal operation, the ECC circuit 23 performs an operation for generating an ECC code.

The ECC-code generation operation is executed as follows: Firstly, data is read from the memory cell array 11-2. The read data is input to the ECC circuit 23 via the DO lines. Using the read data, the ECC circuit 23 generates an ECC code for error correction. The ECC code is written to an ECC-code storing area in the memory cell array 11-2 via the IO buffer circuit 15.

Subsequently, the DRAM macro 10 executes a ROM-data write operation. After finishing the ROM-data write operation, the DRAM macro 10 executes a sleep-mode preparation and establishes the sleep mode. In the sleep mode, the DRAM macro 10 operates in refresh cycles tref of t2.

Whenever a refresh cycle of t2 elapses, the DRAM macro 10 releases the sleep mode to execute a refresh operation. After releasing the sleep mode, the DRAM macro 10 executes a wakeup preparation, and then a ROM-data write-back operation.

After finishing the ROM-data write-back operation, the DRAM macro 10 executes a refresh operation. After finishing the refresh operation, the DRAM macro 10 re-executes the ROM-data write operation. After that, the DRAM macro 10 re-executes the sleep-mode preparation and establishes the sleep mode.

When the sleep mode is released, the DRAM macro 10 executes the wakeup preparation, and the ECC circuit 23 executes an error correction operation.

The error correction operation is executed as follows: Firstly, data and an ECC code are read from the memory cell array 11-2. The read data and ECC code are input to the ECC circuit 23 via the DO lines. Using the ECC code, the ECC circuit 23 executes error correction on the read data. The corrected data is written to the memory cell array 11-2 via the IO buffer circuit 15. Thus, the memory cell data failed in refreshing can be corrected.

After that, the DRAM macro 10 executes a ROM-data write-back operation, and then returns to the normal operation.

Figure 12:
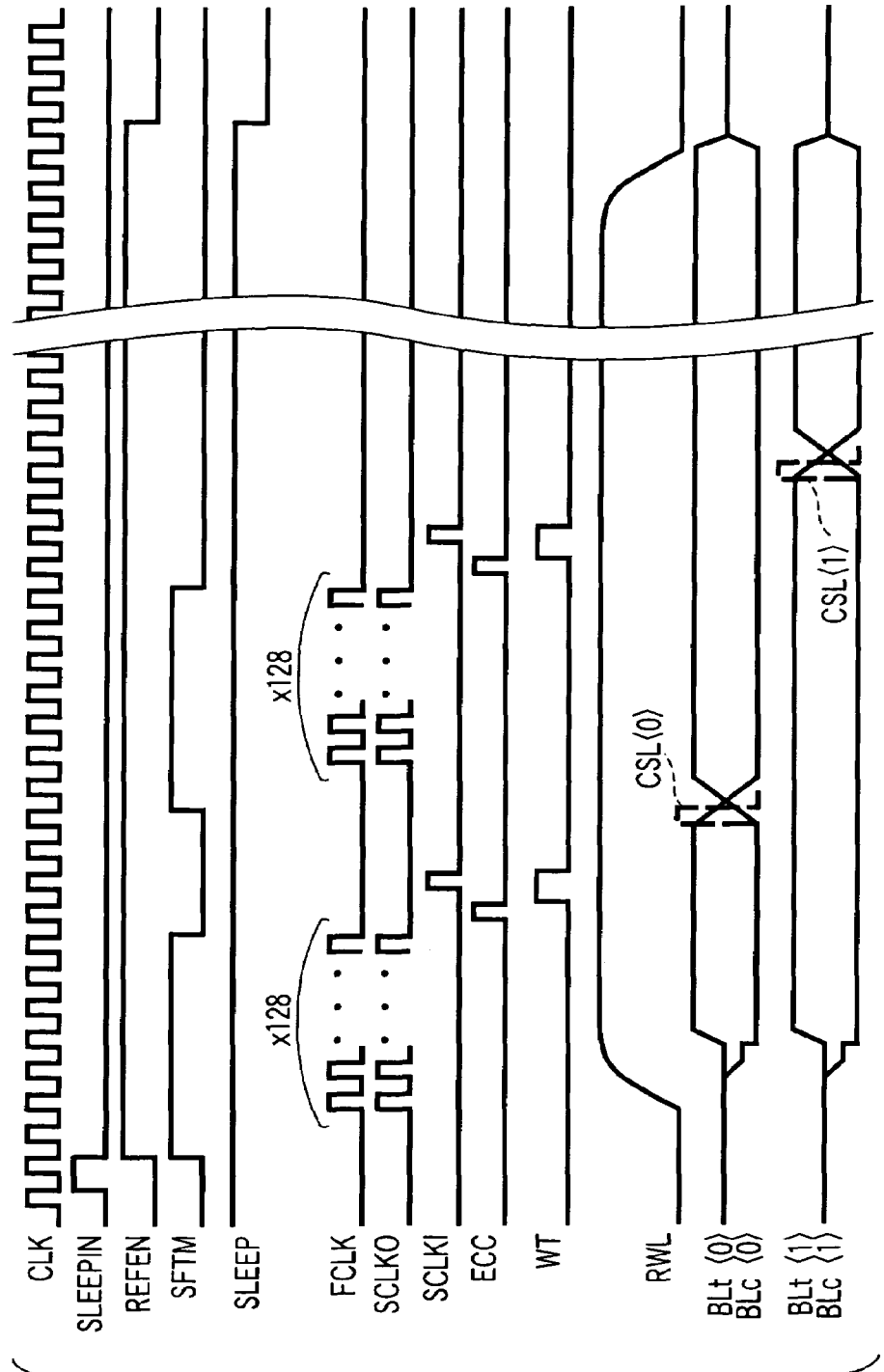
FIG. 12 is a timing chart illustrating the ROM-data write operation of the DRAM macro 10 of the third embodiment.

FIG. 12 is a timing chart illustrating the ROM-data write operation of the DRAM macro 10.

Firstly, signals REFEN and SFTM are activated (set at high levels), thereby establishing a shift register consisting of the ROM-data latch circuits 17 and the IO buffer circuit 15 connected in series. While clock signals FCLK and SCLKO iterate their clock operations 128 times, 128-bit data in the latch circuits 17 is sent to the DO-side flip-flops of the IO buffer circuit 15 via the SFTOUT line. The IO buffer circuit 15 latches the data. On the other hand, the ROM-data word line RWL in the memory cell array 11-2 is activated.

After signals FCLK and SCLKO iterate their clock operations 128 times, signal SFTM is inactivated. Subsequently, the ECC circuit 23 generates an ECC code (one pulse of signal ECC is activated). After that, write command WT is activated and clock signal SCLK executes a one-pulse clock operation. At this time, the data to be written to the memory cell array 11-2 and the ECC code corresponding to the data are fetched by the DI-side flip-flops of the IO buffer circuit 15.

The above-described operations enable the ROM data stored in the IO buffer circuit 15 to be transferred to the sense amplifier 12 via the column redundancy circuit 14 and DQ buffer 13. Thus, the transferred data and ECC code are written to the memory cells MC on the word line RWL connected to column selection gates CSL<0>.

Subsequently, signal SFTM is activated (set at high level) to set the IO buffer circuit 15 in a shift mode. Subsequently, while clock signals FCLK and SCLKO iterate their clock operations 128 times, the next 128-bit data is sent to the DO-side flip-flops of the IO buffer circuit 15 via the SFTOUT line. After all ROM data items are written to the memory cell array 11-2, signal SFTM is inactivated.

Figure 13:
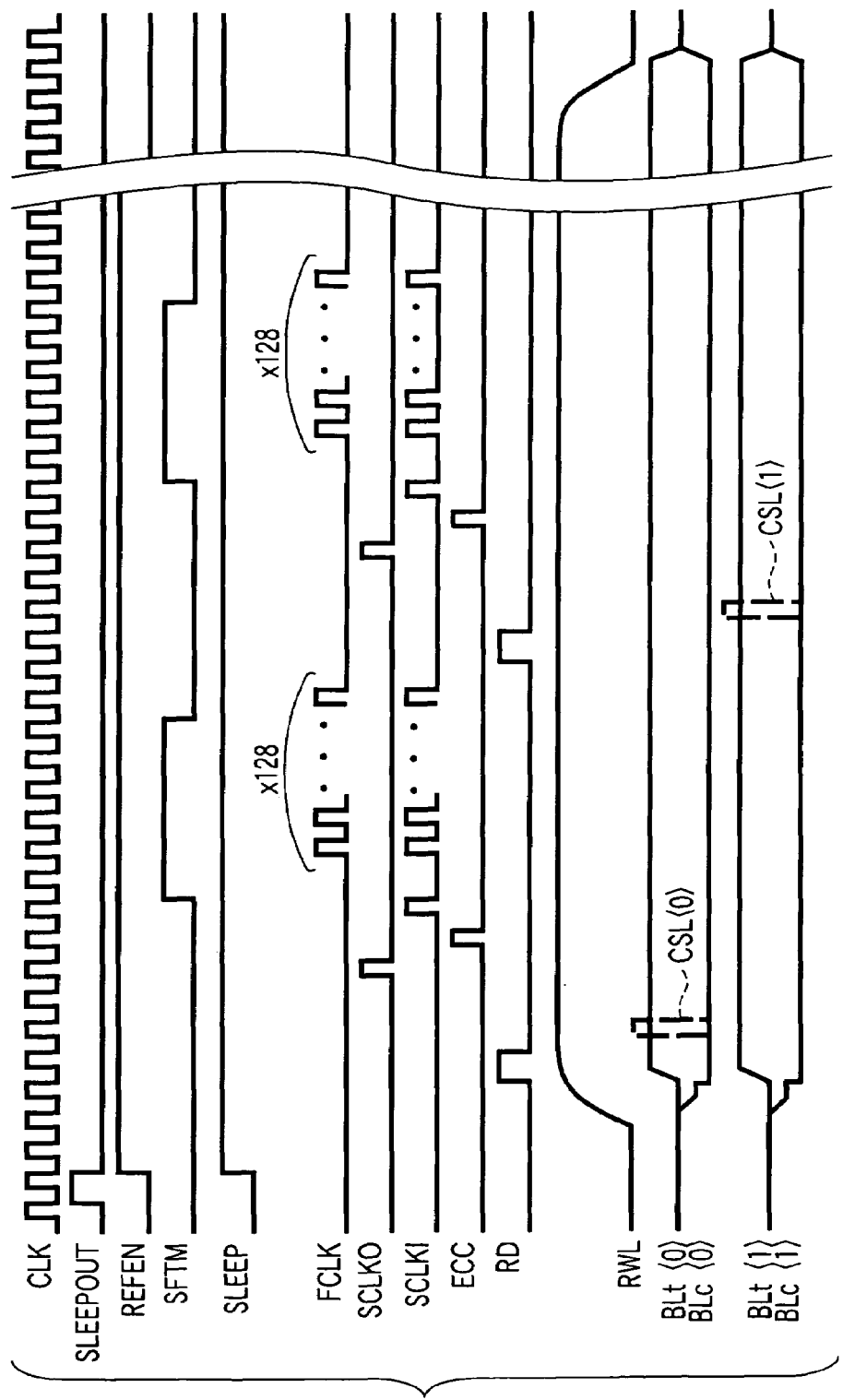
FIG. 13 is a timing chart illustrating the ROM data write-back operation of the DRAM macro 10 according to the third embodiment.

FIG. 13 is a timing chart illustrating the ROM data write-back operation of the DRAM macro 10 according to the third embodiment. When signal SFTM is inactivated (set at low level), the ROM-data word line RWL in the memory cell array 11-2 is activated, and read command RD is activated.

When a time corresponding to read latency after activation of read command RD elapses, clock signal SCLKO is activated by one pulse. As a result, the ROM data and ECC code read from the memory cell array 11-2 are fetched by the DQ-side flip-flops of the IO buffer circuit 15.

Thereafter, the ECC circuit 23 corrects the ROM data (one pulse of the ECC code is activated). Subsequently, signal SCLKI is activated by one clock pulse, the corrected ROM data is fetched by the DI-side flip-flops in the IO buffer circuit 15.

Subsequently, signal SFTM is activated (set at high level), and while clock signals FCLK and SCLKI iterate their clock operations 128 times, the ROM data stored in the IO buffer circuit 15 is transferred to the latch circuits 17. By iterating the above operations, ROM data items can be written back to a desired latch circuit 17.

As described in detail, in the third embodiment, even if an error occurs in the ROM data stored in the memory cell array 11-2, it can be corrected. Namely, ROM-data write operation and write-back operation can be performed more accurately.

The ECC circuit 23 can correct a refresh error that occurs in data other than ROM data. Namely, the third embodiment can also be realized using the ECC circuit for correcting a refresh error in normal data. The third embodiment can provide the same advantages as the first embodiment.

Fourth Embodiment

Figure 14:
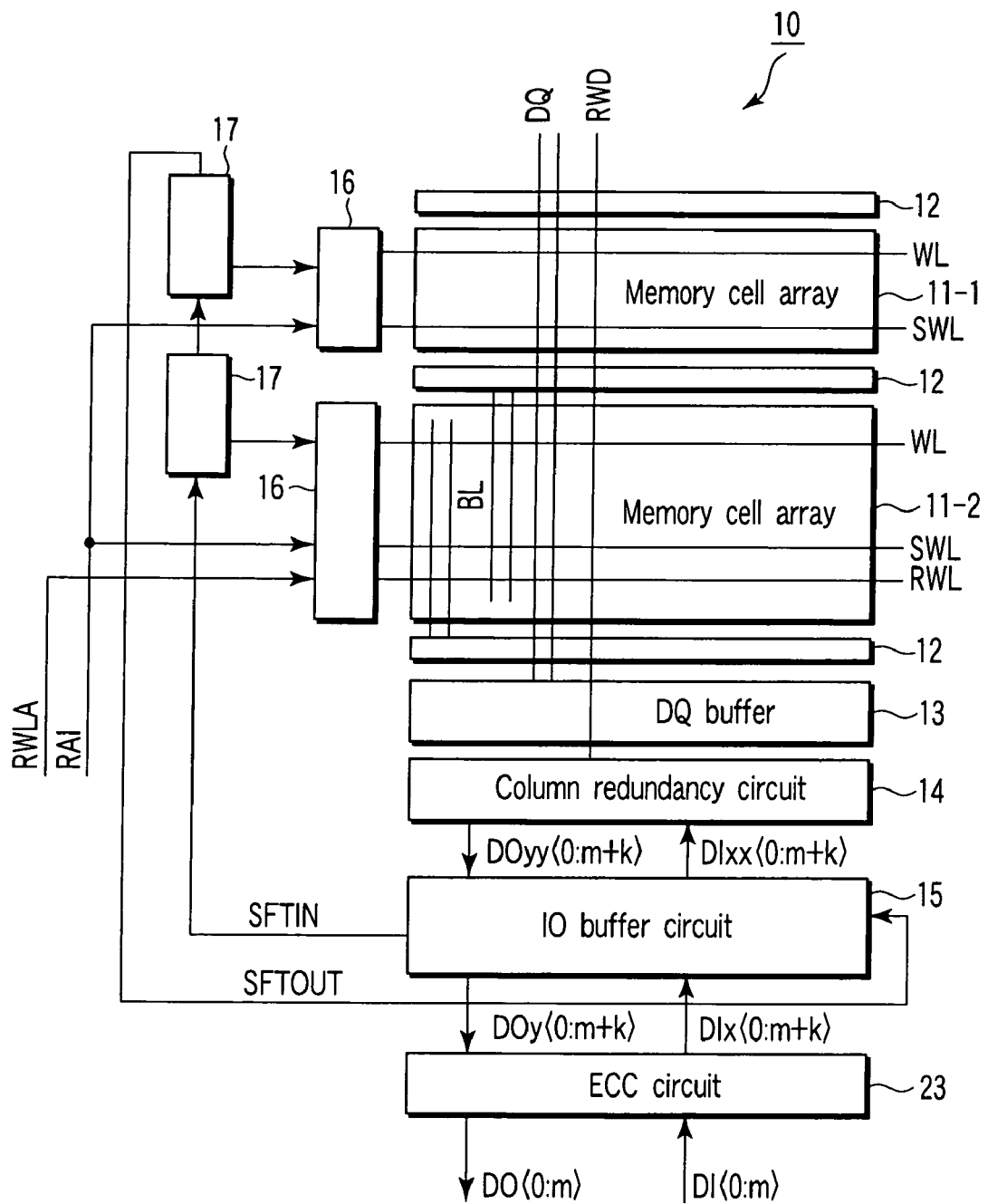
FIG. 14 is a block diagram illustrating the essential part of a DRAM macro 10 according to a fourth embodiment of the invention.

A fourth embodiment of the invention is directed to a DRAM macro 10 having an ECC function and a configuration different from that of the DRAM macro 10 of the third embodiment. FIG. 14 is a block diagram illustrating the configuration of the essential part of the DRAM macro 10 according to the fourth embodiment. The other parts of the configuration are similar to those of the first embodiment of FIG. 1. The IO buffer circuit 15 of FIG. 14 has the same circuit design as the IO buffer circuit employed in the first embodiment.

Firstly, an ECC operation performed in the normal mode will be described. As shown in FIG. 14, the ECC circuit 23 receives externally input data DI<0:m> of (m+1) bits. Using input data DI<0:m>, the ECC circuit 23 generates a k-bit ECC code, and supplies the IO buffer circuit 15 with data DIx<0:m+k> formed of the (m+1)-bit input data and the k-bit ECC code.

The IO buffer circuit 15 supplies the column redundancy circuit 14 with data DIxx<0:m+k> corresponding to DIx<0:m+k>.

On the other hand, read data read from a memory cell array and an ECC code corresponding thereto are supplied as data Doyy<0:m+k> to the IO buffer circuit 15 via the column redundancy circuit 14. The IO buffer circuit 15 supplies the ECC circuit 23 with DOy<0:m+k> corresponding to DOyy<0:m+k>.

Using the k-bit ECC code contained in data DOy<0:m+k>, the ECC circuit 23 performs error correction of data DOy<0:m+k>, and outputs corrected output data DO<0:m> to the outside.

Also in the sleep mode, the ECC circuit 23 of FIG. 14 generates an ECC code and performs error correction using the ECC code. The flow of data is similar to that employed in the third embodiment.

The DRAM macro 10 having the above-described ECC function can provide the same advantages as those of the third embodiment.

Figure 15:
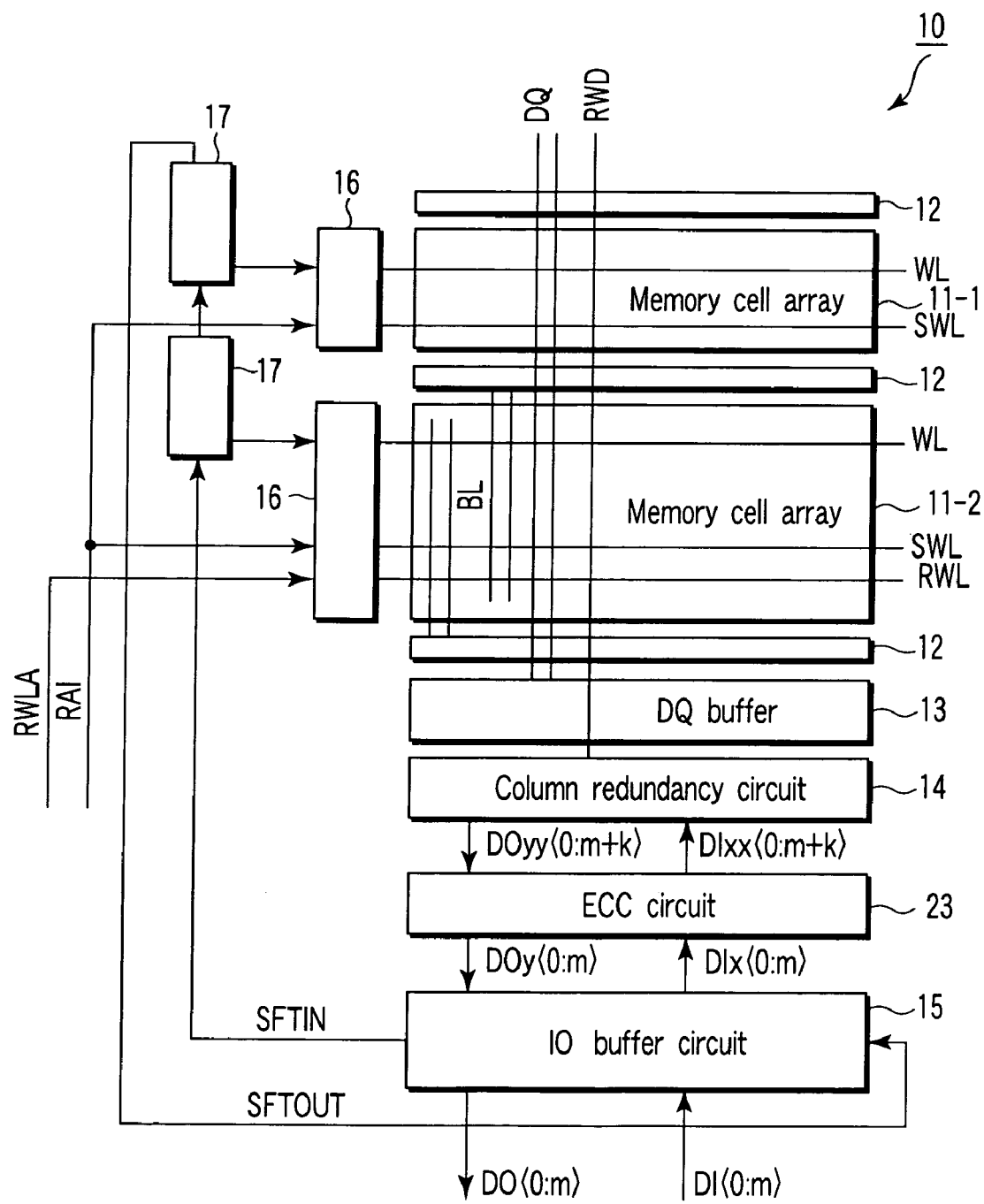
FIG. 15 is a block diagram illustrating another configuration of a DRAM macro 10 having an ECC function.

Further, the DRAM macro 10 having an ECC function may have the configuration as shown in FIG. 15. The ECC circuit 23 shown in FIG. 15 is interposed between the column redundancy circuit 14 and IO buffer circuit 15. This DRAM macro 10 can provide the same advantages as the above.

Fifth Embodiment

A fifth embodiment is directed to another configuration for reducing refresh errors. In the fifth embodiment, the memory cell array 11-2 comprises two ROM-data word lines RWL to increase the charge to be transferred to each bit line when ROM data is read from the memory cell array 11-2, thereby reducing refresh errors.

Figure 16:
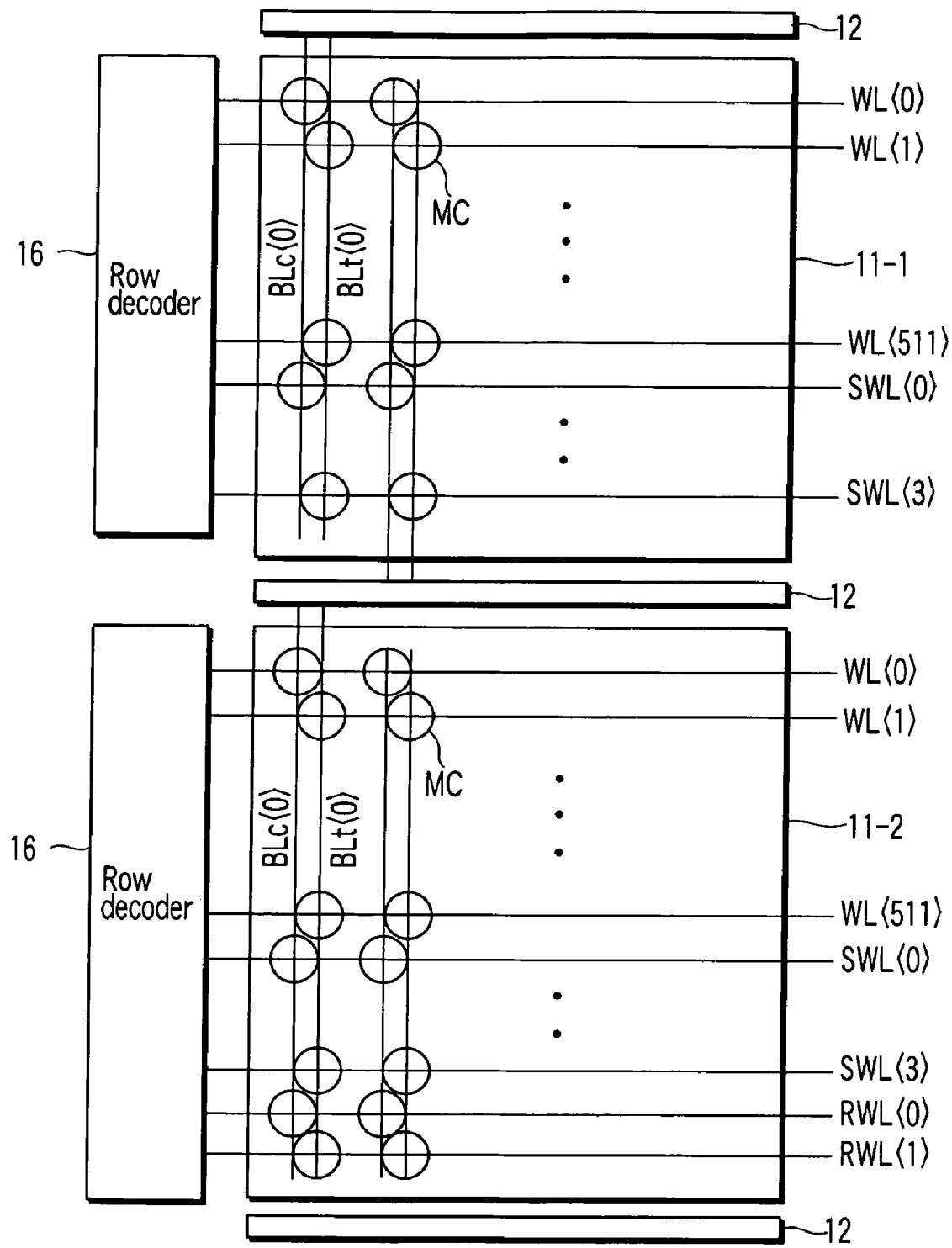
FIG. 16 is a block diagram illustrating memory cell arrays 11-1 and 11-2 according to a fifth embodiment of the invention.

FIG. 16 is a block diagram illustrating the logical organizations of memory cell arrays 11-1 and 11-2 according to the fifth embodiment. The other parts of the configuration of the fifth embodiment are similar to those of FIG. 1.

The memory cell array 11-2 employs two ROM-data word lines RWL<0> and RWL<1> extending in the row direction. Complementary data items for ROM data are supplied to the ROM-data word lines RWL<0> and RWL<1>.

When reading ROM data from the memory cell array 11-2, the two word lines RWL<0> and RWL<1> are simultaneously activated. As a result, the charge corresponding to double the signal amount is transferred to each bit line. Accordingly, even if a weak refresh bit exists on a word line RWL, the probability of occurrence of a refresh error can be reduced. The other functions and advantages of the fifth embodiment are similar to those of the first embodiment.

Sixth Embodiment

A sixth embodiment is directed to the case of using the spare word line SWL for a redundancy circuit as a word line for storing ROM data. FIG. 17 is a block diagram illustrating a DRAM macro 10 according to the sixth embodiment.

The DRAM macro 10 of the sixth embodiment comprises a plurality of memory cell arrays 11-1. Each memory cell array 11-1 includes, for example, 512 word lines WL<0> to WL<511> and a spare word line SWL, which extend in the row direction. FIG. 17 only shows the spare word line SWL for simplification. The word lines WL and spare word line SWL are connected to a row decoder 16.

In the sixth embodiment, the spare word line SWL for redundancy is used as a word line for ROM data. It is very rare to use all spare word lines SWL of the memory cell arrays. If all spare word lines SWL are used, it is considered that the semiconductor memory device has an extremely low quality.

Data (address signal) on a spare word line SWL used to supply ROM data and included in the spare word lines SWL, which are not used to save a defective cell, is latched by an address latch circuit 32. It is impossible to cut the current path to the address latch circuit 32. However, this will raise almost no problems, since the data latched by the address latch circuit 32 is of several bits. The address signal output from the address latch circuit 32 is supplied to an address control circuit 18.

The address control circuit 18 generates internal row address signal RAI based on externally input address signal AD. It also generates redundancy invalidation signal RDIS for invalidating the redundancy function during testing, and spare row address signal XS for selecting spare word line SWL during testing.

During a normal operation, the address control circuit 18 inactivates signals RDIS and XS to validate the redundancy function. In contrast, during testing each spare word line SWL, the address control circuit 18 activates signals RDIS and XS to access spare word line SWL. During testing each word line WL, the address control circuit 18 inactivates signal XS. Row address signal RAI, redundancy invalidation signal RDIS and spare row address signal XS are supplied to the row decoders 16.

The row decoders 16 are also supplied with ROM data as redundancy data output from the ROM-data latch circuits 17. Each row decoder 16 activates the corresponding memory cell array when row address signal RAI for row activation corresponds to the array address assigned thereto.

Further, when signal RDIS is inactivated, each row decoder 16 compares ROM data with row address signal RAI. When the ROM data (redundancy data) output from the corresponding ROM-data latch circuit 17 corresponds to row address signal RAI, each row decoder 16 activates the corresponding spare word line SWL.

In contrast, when the ROM data does not correspond to row address signal RAI, each row decoder 16 activates the word line WL corresponding to row address signal RAI.

Further, when signals RDIS and XS are activated during testing, each row decoder 16 ignores row address signal RAI and activates the spare word line SWL.

Signal RDIS is inactivated in the normal mode. When the mode is returned to the sleep mode, the address control circuit 18 activates signals RDIS and XS, and outputs address signal latched by the address latch circuit 32 as row address signal RAI. As a result, the ROM data latched by the ROM-data latch circuits 17 is stored into the memory cells on the spare word line SWL in the memory cell array 11-1 designated by the address latch circuit 32.

Also when the sleep mode is released, the address control circuit 18 activates signals RDIS and XS, and outputs address signal latched by the address latch circuit 32 as row address signal RAI. As a result, the ROM data stored in the memory cells on the spare word line SWL in the memory cell array 11-1 designated by the address latch circuit 32 is written back to the corresponding ROM-data latch circuit 17.

As in the DRAM macro 10 shown in FIG. 1, the IO buffer circuit 15 is connected to the ROM-data latch circuits 17, and the ROM data on the selected word line SWL is latched by the corresponding latch circuit 17 via the IO buffer circuit 15. The DRAM macro 10 of the sixth embodiment is similar to that of the first embodiment except that in the former, the ROM-data word line RWL is replaced with an unused spare word line SWL. Therefore, no description is given of the operation of the DRAM macro 10.

As described above in detail, in the sixth embodiment, a spare word line SWL is used to hold ROM data instead of the ROM-data word line RWL. Accordingly, the sixth embodiment can reduce the consumption of power, without using a special memory cell array (such as the memory cell array 11-2 in FIG. 1), which additionally employs the ROM-data word line RWL.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device operating using read only memory (ROM) data transferred from an external circuit to the device upon turn-on, comprising:
   a first latch circuit which latches the ROM data;
   a memory cell array including a plurality of memory cells and having a first region and a second region, the first region storing data; and
   a buffer circuit having a function for accessing the first latch circuit, the buffer circuit transferring, to the second region, the ROM data transferred from the first latch circuit, and transferring, to the first latch circuit, the ROM data transferred from the second region,
   wherein the ROM data is required to operate memory functions which vary from chip to chip.

2. The semiconductor memory device according to claim 1, wherein the buffer circuit latches the ROM data transferred from the first latch circuit, and latches the ROM data transferred from the second region.

3. The semiconductor memory device according to claim 2, wherein the buffer circuit transfers input data to the memory cell array, and outputs, to an outside, output data transferred from the memory cell array.

4. The semiconductor memory device according to claim 1, wherein supply of power to the first latch circuit is interrupted in a sleep mode.

5. The semiconductor memory device according to claim 4, wherein supply of power to the buffer circuit is interrupted in the sleep mode.

6. The semiconductor memory device according to claim 1, wherein the buffer circuit transfers, to the second region, the ROM data transferred from the first latch circuit before a sleep mode is established.

7. The semiconductor memory device according to claim 6, wherein the buffer circuit transfers, to the first latch circuit, the ROM data transferred from the second region after the sleep mode is released.

8. The semiconductor memory device according to claim 1, wherein the first latch circuit and the buffer circuit include respective shift registers.

9. The semiconductor memory device according to claim 8, wherein the shift registers include a plurality of flip-flops connected in series.

10. The semiconductor memory device according to claim 8, wherein the first latch circuit and the buffer circuit are connected in series during transferring the ROM data.

11. The semiconductor memory device according to claim 1, further comprising a correction circuit which corrects an error in the ROM data stored in the second region.

12. The semiconductor memory device according to claim 11, wherein the correction circuit generates a correction code for correcting the error, using the ROM data transferred from the first latch circuit, and corrects, using the correction code, the error in the ROM data transferred from the second region, the correction code being stored in the second region.

13. The semiconductor memory device according to claim 1, further comprising a redundancy cell array including a plurality of redundancy cells, and wherein the ROM data is redundancy data used to replace a defective cell in the memory cell array with the redundancy cells.

14. The semiconductor memory device according to claim 13, further comprising:
   a plurality of word lines which select respective rows included in the memory cell array; and
   a plurality of bit lines which selects respective columns included in the memory cell array, the bit lines being electrically connected to the buffer circuit, and wherein the ROM data is row-directional row redundancy data.

15. The semiconductor memory device according to claim 14, further comprising a second latch circuit, and wherein:
   the ROM data includes row-directional row redundancy data and column-directional column redundancy data;
   the first latch circuit latches the row redundancy data; and
   the second latch circuit latches the column redundancy data.

16. The semiconductor memory device according to claim 15, wherein supply of power to the first latch circuit is interrupted in a sleep mode, and supply of power to the second latch circuit is not interrupted in the sleep mode.

17. The semiconductor memory device according to claim 1, wherein the ROM data regulates operation timing or an operation voltage.

18. The semiconductor memory device according to claim 14, wherein the row redundancy data is stored in respective two rows corresponding to two word lines which are included in the second region, the two word lines being activated simultaneously.

19. The semiconductor memory device according to claim 1, wherein the second region corresponds to a redundancy cell array to be replaced with a defective cell included in the first region.

20. The semiconductor memory device according to claim 19, further comprising a plurality of spare word lines which select respective rows included in the redundancy cell array.

* * * * *